United States Patent
Chung et al.

(10) Patent No.: US 10,850,623 B2
(45) Date of Patent: Dec. 1, 2020

(54) STACKED ELECTRIC VEHICLE INVERTER CELLS

(71) Applicant: SF Motors, Inc., Santa Clara, CA (US)

(72) Inventors: Nathan Chung, Santa Clara, CA (US); Zhong Nie, Santa Clara, CA (US); Duanyang Wang, Santa Clara, CA (US); Yifan Tang, Santa Clara, CA (US)

(73) Assignees: SF Motors, Inc., Santa Clara, CA (US); CHONGQING JINKANG NEW ENERGY VEHICLE CO., LTD., Chongqing (CN)

( * ) Notice: Subject to any disclaimer, the term of this patent is extended or adjusted under 35 U.S.C. 154(b) by 154 days.

(21) Appl. No.: 16/131,459

(22) Filed: Sep. 14, 2018

(65) Prior Publication Data
US 2019/0126773 A1   May 2, 2019

Related U.S. Application Data

(60) Provisional application No. 62/578,821, filed on Oct. 30, 2017.

(51) Int. Cl.
  *B60L 15/00* (2006.01)
  *H05K 7/20* (2006.01)
  (Continued)

(52) U.S. Cl.
  CPC ............ *B60L 15/007* (2013.01); *H02K 9/19* (2013.01); *H05K 7/20254* (2013.01);
  (Continued)

(58) Field of Classification Search
  CPC ........... H05K 7/20254; H05K 7/20509; H05K 7/20827; H05K 7/20927; H05K 7/20872
  See application file for complete search history.

(56) References Cited

U.S. PATENT DOCUMENTS 3,845,661 A * 11/1974 Hollweck ................ F16J 15/16
                                                  374/208
4,382,156 A    5/1983 Jodoin
(Continued)

FOREIGN PATENT DOCUMENTS

CN    203850295      9/2014
CN    204442853 U    7/2015
(Continued)

OTHER PUBLICATIONS

Final Office Action on U.S. Appl. No. 16/110,475 dated Sep. 17, 2019 (17 pages).
(Continued)

*Primary Examiner* — Robert J Hoffberg
(74) *Attorney, Agent, or Firm* — Foley & Lardner LLP; James De Vellis

(57) ABSTRACT

Provided herein is an inverter module that can include a first inverter cell and a second inverter cell, each including at least one transistor device, and a cold plate placed in contact with or proximate to the at least one transistor device. The cold plate can have a coolant channel through the cold plate. A connector can connect a coolant outlet of the cold plate of the first inverter cell to a coolant inlet of the cold plate of the second inverter cell in series, to form a continuous channel that extends from the first coolant inlet of the cold plate of the first inverter cell into the coolant channel of the cold plate of the second inverter cell. The coolant inlet of the cold plate of the first inverter cell can receive coolant fluid into the continuous channel.

19 Claims, 13 Drawing Sheets

(51) Int. Cl.
*H02K 9/19* (2006.01)
*B60K 1/00* (2006.01)

(52) U.S. Cl.
CPC ..... *H05K 7/20509* (2013.01); *H05K 7/20872* (2013.01); *H05K 7/20927* (2013.01); *B60K 2001/003* (2013.01); *B60L 2210/40* (2013.01)

(56) References Cited

U.S. PATENT DOCUMENTS

| | | | |
|---|---|---|---|
| 4,502,107 A | 2/1985 | Nilssen | |
| 4,584,768 A | 4/1986 | Tosti | |
| 5,365,424 A | 11/1994 | Deam et al. | |
| 5,371,043 A | 12/1994 | Anderson et al. | |
| 5,436,997 A | 7/1995 | Makiuchi et al. | |
| 5,514,906 A | 5/1996 | Love et al. | |
| 5,566,061 A * | 10/1996 | Uchino | H02M 7/49 363/31 |
| 5,631,574 A | 5/1997 | Kazama | |
| 5,783,877 A | 7/1998 | Chitayat | |
| 5,804,761 A | 9/1998 | Donegan et al. | |
| 5,847,938 A | 12/1998 | Gammon | |
| 5,914,860 A * | 6/1999 | Janko | F28F 13/00 361/710 |
| 6,031,751 A * | 2/2000 | Janko | F28F 13/00 165/104.33 |
| 6,176,299 B1 | 1/2001 | Hanzlik et al. | |
| 6,272,028 B1 * | 8/2001 | Satoh | H02M 1/12 363/141 |
| 6,529,394 B1 * | 3/2003 | Joseph | H02M 7/003 361/689 |
| 6,721,181 B1 * | 4/2004 | Pfeifer | H02M 7/003 165/80.4 |
| 6,822,850 B2 | 11/2004 | Pfeifer et al. | |
| 6,843,335 B2 | 1/2005 | Shirakawa et al. | |
| 7,012,810 B2 | 3/2006 | Parkhill et al. | |
| 7,046,535 B2 | 5/2006 | Rodriguez et al. | |
| 7,113,405 B2 | 9/2006 | Armstrong et al. | |
| 7,292,451 B2 | 11/2007 | Rodriguez et al. | |
| 7,505,294 B2 | 3/2009 | Ahmed et al. | |
| 7,551,439 B2 | 6/2009 | Peugh et al. | |
| 7,557,298 B2 | 7/2009 | Vanhoutte et al. | |
| 7,714,230 B2 | 5/2010 | Beulque | |
| 7,742,303 B2 | 6/2010 | Azuma et al. | |
| 7,742,307 B2 | 6/2010 | Ellsworth et al. | |
| 7,777,433 B2 | 8/2010 | Yamaguchi et al. | |
| 7,940,526 B2 * | 5/2011 | Schulz-Harder | H01L 23/473 165/104.33 |
| 7,965,510 B2 | 6/2011 | Suzuki et al. | |
| 7,969,735 B2 | 6/2011 | Nakatsu et al. | |
| 8,059,404 B2 | 11/2011 | Miller et al. | |
| 8,355,244 B2 * | 1/2013 | Kimura | H05K 7/209 361/676 |
| 8,391,008 B2 * | 3/2013 | Dede | H01L 23/4735 361/702 |
| 8,400,791 B2 * | 3/2013 | Campbell | H02M 7/537 363/34 |
| 8,519,561 B2 | 8/2013 | Azuma et al. | |
| 8,575,882 B2 * | 11/2013 | Radosevich | H02M 7/493 318/800 |
| 8,675,376 B2 * | 3/2014 | Campbell | H02M 7/537 363/34 |
| 8,730,672 B2 * | 5/2014 | Ebersberger | H01L 23/473 174/15.1 |
| 8,773,007 B2 | 7/2014 | Van De Ven et al. | |
| 8,780,557 B2 | 7/2014 | Duppong et al. | |
| 8,888,506 B2 | 11/2014 | Nishimura et al. | |
| 8,947,899 B2 | 2/2015 | Savatski et al. | |
| 8,952,525 B2 | 2/2015 | Ide et al. | |
| 9,007,767 B2 | 4/2015 | Nakajima | |
| 9,225,263 B2 * | 12/2015 | Radosevich | H02M 7/539 |
| 9,247,679 B2 | 1/2016 | Joshi et al. | |
| 9,247,697 B2 | 2/2016 | Chen et al. | |
| 9,439,332 B2 | 9/2016 | Ide et al. | |
| 9,445,526 B2 * | 9/2016 | Zhou | H05K 7/20281 |
| 9,516,789 B2 * | 12/2016 | Garriga | H01L 23/3675 |
| 9,565,792 B2 * | 2/2017 | Ishikawa | F28F 9/26 |
| 9,578,788 B2 | 2/2017 | Tang et al. | |
| 9,647,361 B2 | 5/2017 | Kobuchi et al. | |
| 9,854,718 B2 * | 12/2017 | Garriga | H01L 23/3675 |
| 10,021,811 B2 * | 7/2018 | Schaltz | G06F 1/20 |
| 10,122,294 B2 | 11/2018 | Xu et al. | |
| 10,215,504 B2 | 2/2019 | Coteus et al. | |
| 10,236,786 B2 | 3/2019 | Liu et al. | |
| 10,236,791 B1 | 3/2019 | Chung et al. | |
| 10,263,407 B1 | 4/2019 | Song et al. | |
| 10,314,209 B2 * | 6/2019 | Garriga | H05K 7/209 |
| 10,594,230 B2 * | 3/2020 | Chung | H05K 7/20945 |
| 2003/0111714 A1 | 6/2003 | Bates et al. | |
| 2003/0133257 A1 | 7/2003 | Beihoff et al. | |
| 2003/0218057 A1 | 11/2003 | Joseph et al. | |
| 2004/0060692 A1 | 4/2004 | Pfeifer et al. | |
| 2004/0227231 A1 | 11/2004 | Maly et al. | |
| 2004/0228094 A1 | 11/2004 | Ahmed et al. | |
| 2006/0092611 A1 | 5/2006 | Beihoff et al. | |
| 2006/0274561 A1 | 12/2006 | Ahmed et al. | |
| 2006/0291165 A1 | 12/2006 | Flesch et al. | |
| 2007/0236883 A1 | 10/2007 | Ruiz | |
| 2007/0246351 A1 | 10/2007 | Smola et al. | |
| 2007/0252169 A1 | 11/2007 | Tokuyama et al. | |
| 2008/0247139 A1 | 10/2008 | Stahlhut et al. | |
| 2008/0316710 A1 | 12/2008 | Seto et al. | |
| 2009/0129011 A1 | 5/2009 | Balzano | |
| 2010/0025126 A1 | 2/2010 | Nakatsu et al. | |
| 2010/0026090 A1 | 2/2010 | Nakatsu et al. | |
| 2010/0277868 A1 | 11/2010 | Beaupre et al. | |
| 2010/0290190 A1 | 11/2010 | Chester et al. | |
| 2012/0325447 A1 | 12/2012 | You et al. | |
| 2013/0114210 A1 | 5/2013 | Ebersberger et al. | |
| 2013/0146253 A1 | 6/2013 | Daly | |
| 2013/0146254 A1 | 6/2013 | Jeon et al. | |
| 2013/0235527 A1 | 9/2013 | Wagner et al. | |
| 2014/0133150 A1 | 5/2014 | Pardikes et al. | |
| 2014/0262177 A1 | 9/2014 | Tang et al. | |
| 2014/0307389 A1 | 10/2014 | Arvelo et al. | |
| 2014/0345492 A1 | 11/2014 | Fujito et al. | |
| 2014/0347817 A1 | 11/2014 | Joshi et al. | |
| 2014/0369099 A1 | 12/2014 | Asako | |
| 2015/0003019 A1 | 1/2015 | Ide et al. | |
| 2015/0021756 A1 | 1/2015 | Adachi | |
| 2015/0289391 A1 | 10/2015 | Nakatsu et al. | |
| 2016/0155572 A1 | 6/2016 | Ramm et al. | |
| 2016/0156278 A1 | 6/2016 | Ramm et al. | |
| 2016/0183409 A1 | 6/2016 | Zhou et al. | |
| 2016/0242312 A1 | 8/2016 | Singh et al. | |
| 2017/0028869 A1 | 2/2017 | Boddakayala et al. | |
| 2017/0330815 A1 | 11/2017 | Mische et al. | |
| 2018/0184538 A1 | 6/2018 | Bayerer | |
| 2018/0184543 A1 | 6/2018 | Ando et al. | |
| 2018/0198378 A1 | 7/2018 | Xu et al. | |
| 2018/0206359 A1 | 7/2018 | McPherson et al. | |
| 2018/0330895 A1 | 11/2018 | Nagayoshi et al. | |
| 2019/0296656 A1 * | 9/2019 | Chung | H05K 7/20945 |
| 2019/0296657 A1 * | 9/2019 | Chung | H01L 23/473 |
| 2019/0296658 A1 * | 9/2019 | Chung | H05K 7/1432 |
| 2019/0335607 A1 | 10/2019 | Song et al. | |
| 2019/0335608 A1 | 10/2019 | Song et al. | |

FOREIGN PATENT DOCUMENTS

| | | |
|---|---|---|
| CN | 106656021 A | 5/2017 |
| CN | 106848118 A | 6/2017 |
| CN | 107769604 A | 3/2018 |

OTHER PUBLICATIONS

Notice of Allowance on U.S. Appl. No. 16/051,176 dated Sep. 18, 2019 (9 pages).

Notice of Allowance on U.S. Appl. No. 16/051,991 dated Sep. 18, 2019 (9 pages).

Notice of Allowance on U.S. Appl. No. 16/110,513 dated Sep. 4, 2019 (9 pages).

(56) References Cited

OTHER PUBLICATIONS

Notice of Allowance on U.S. Appl. No. 16/233,842 dated Sep. 18, 2019 (11 pages).
Notice of Allowance on U.S. Appl. No. 16/234,242 dated Mar. 16, 2020 (9 pages).
Notice of Allowance on U.S. Appl. No. 16/110,559 dated Mar. 30, 2020 (9 pages).
Notice of Allowance on U.S. Appl. No. 16/233,842 dated Nov. 20, 2019 (8 pages).
Non-Final Office Action on U.S. Appl. No. 16/110,513 dated May 13, 2019.
Notice of Allowance on U.S. Appl. No. 16/051,176 dated May 22, 2019.
Notice of Allowance on U.S. Appl. No. 16/051,991 dated May 20, 2019.
Final Office Action on U.S. Appl. No. 16/110,559 dated Dec. 26, 2019 (18 pages).
Notice of Allowance on U.S. Appl. No. 16/051,176 dated Jan. 22, 2020 (10 pages).
Notice of Allowance on U.S. Appl. No. 16/051,193 dated Jan. 10, 2020 (9 pages).
Notice of Allowance on U.S. Appl. No. 16/051,991 dated Jan. 22, 2020 (10 pages).
Notice of Allowance on U.S. Appl. No. 16/110,425 dated Jan. 16, 2020 (8 pages).
Notice of Allowance on U.S. Appl. No. 16/110,513 dated Jan. 2, 2020 (9 pages).
Notice of Allowance on U.S. Appl. No. 16/233,028 dated Jan. 16, 2020 (9 pages).
Notice of Allowance on U.S. Appl. No. 16/233,826 dated Jan. 30, 2020 (9 pages).
Notice of Allowance on U.S. Appl. No. 16/233,842 dated Dec. 20, 2019 (4 pages).
Notice of Allowance on U.S. Appl. No. 16/110,475 dated Nov. 22, 2019 (8 pages).
Notice of Allowance on U.S. Appl. No. 16/051,190 dated Nov. 7, 2019 (10 pages).
Notice of Allowance on U.S. Appl. No. 16/110,513 dated Oct. 17, 2019 (2 pages).
Notice of Allowance on U.S. Appl. No. 16/234,242 dated Oct. 24, 2019 (11 pages).
International Search Report and Written Opinion for PCT/CN2019/079353 dated Jul. 1, 2019 (11 pages).
International Search Report and Written Opinion on PCT/CN2019/079350 dated Jul. 3, 2019 (11 pages).
International Search Report and Written Opinion on PCT/CN2019/079352 dated Jun. 8, 2019 (11 pages).
Notice of Allowance on U.S. Appl. No. 16/051,176 dated Jul. 31, 2019.
Notice of Allowance on U.S. Appl. No. 16/051,190 dated Jul. 1, 2019.
Notice of Allowance on U.S. Appl. No. 16/051,193 dated Jul. 3, 2019.
Notice of Allowance on U.S. Appl. No. 16/051,991 dated Jun. 18, 2019.
Notice of Allowance on U.S. Appl. No. 16/110,425 dated Jul. 30, 2019.
Notice of Allowance on U.S. Appl. No. 16/232,981 dated Aug. 13, 2019.
Notice of Allowance on U.S. Appl. No. 16/233,028 dated Jul. 3, 2019.
Notice of Allowance on U.S. Appl. No. 16/233,826 dated Jul. 31, 2019.
Notice of Allowance on U.S. Appl. No. 16/051,190 dated Nov. 26, 2019 (2 pages).
Notice of Allowance on U.S. Appl. No. 16/232,981 dated Dec. 17, 2019 (10 pages).
International Search Report and Written Opinion for International Appl. No. PCT/CN2018/125644, dated Apr. 2, 2019.
Non-Final Office Action on U.S. Appl. No. 16/051,182 dated Nov. 2, 2018.
Non-Final Office Action on U.S. Appl. No. 16/051,190 dated Mar. 13, 2019.
Non-Final Office Action on U.S. Appl. No. 16/051,193 dated Apr. 9, 2019.
Non-Final Office Action on U.S. Appl. No. 16/110,425 dated Apr. 11, 2019.
Non-Final Office Action on U.S. Appl. No. 16/110,475 dated Mar. 13, 2019.
Non-Final Office Action on U.S. Appl. No. 16/110,559 dated Feb. 25, 2019.
Non-Final Office Action on U.S. Appl. No. 16/232,981 dated Mar. 13, 2019.
Non-Final Office Action on U.S. Appl. No. 16/233,028 dated Apr. 9, 2019.
Non-Final Office Action on U.S. Appl. No. 16/233,826 dated Apr. 11, 2019.
Non-Final Office Action on U.S. Appl. No. 16/233,842 dated Mar. 13, 2019.
Non-Final Office Action on U.S. Appl. No. 16/234,242 dated Feb. 25, 2019.
Notice of Allowance on U.S. Appl. No. 16/051,182 dated Jan. 3, 2019.
Notice of Allowance on U.S. Appl. No. 16/234,238 dated Feb. 20, 2019.

* cited by examiner

STACKED ELECTRIC VEHICLE INVERTER CELLS

CROSS REFERENCE TO RELATED APPLICATIONS

The present application claims the benefit of priority under 35 U.S.C. § 119(e) to U.S. Provisional Application 62/578,821, titled "STACKED INVERTER CELLS", filed on Oct. 30, 2017. The entire disclosure of which is incorporated herein by reference in its entirety.

BACKGROUND

Vehicles such as in plug-in hybrid electrical vehicles (PHEVs), hybrid electrical vehicles (HEVs), electrical vehicle (EV), or other automotive or non-automotive vehicles and machines can include an on board power system. The power system can include batteries or fuel cells, gasoline or other fossil fuel or plant based fuels, as well as combinations thereof.

SUMMARY

The present disclosure is directed an inverter module which can be incorporated into a power converter component to power a drive unit of an electric vehicle drive system. The inverter module can include multiple inverter cells arranged in various stacked configurations for different electric vehicle drive systems. The various stacked configurations provide continuous channels for coolant flow to transfer heat generated in the inverter cells away from the inverter cells. The inverter module can be coupled with a drive train unit of the electric vehicle and can be configured to provide multi-phase voltages to the drive train unit.

At least one aspect is directed to an inverter module. The inverter module can include a first inverter cell and a second inverter cell in an electric vehicle. Each of the first inverter cell and the second inverter cell can include at least one transistor device; and a cold plate placed in contact with or proximate to the at least one transistor device. The cold plate can have a coolant channel through the cold plate. The coolant channel can have a coolant inlet at a first side of the cold plate and a coolant outlet on a second side of the cold plate opposite to the first side. The inverter module can include a connector to connect the coolant outlet of the cold plate of the first inverter cell to the coolant inlet of the cold plate of the second inverter cell in series, to form a continuous channel that extends from the first coolant inlet of the cold plate of the first inverter cell into the coolant channel of the cold plate of the second inverter cell. The connector can have one end that mates with the coolant outlet of the cold plate of the first inverter cell, and another end that mates with the coolant inlet of the cold plate of the second inverter cell. The coolant inlet of the cold plate of the first inverter cell can receive coolant fluid into the continuous channel to cool the first inverter cell and the second inverter cell.

At least one aspect is directed to a method. The method can include providing a first inverter cell and a second inverter cell in an inverter module. Each of the first inverter cell and the second inverter cell can have at least one transistor device and a cold plate placed in contact with or proximate to the at least one transistor device. The cold plate can have a coolant channel through the cold plate. The coolant channel can have a coolant inlet at a first side of the cold plate and a coolant outlet on a second side of the cold plate opposite to the first side. A connector can connect the coolant outlet of the cold plate of the first inverter cell to the coolant inlet of the cold plate of the second inverter cell in series, to form a continuous channel that extends from the first coolant inlet of the cold plate of the first inverter cell into the coolant channel of the cold plate of the second inverter cell. The connector can have one end that mates with the coolant outlet of the cold plate of the first inverter cell, and another end that mates with the coolant inlet of the cold plate of the second inverter cell. The coolant inlet of the cold plate of the first inverter cell can receive coolant fluid into the continuous channel to cool the first inverter cell and the second inverter cell.

At least one aspect is directed to an electric vehicle. The electric vehicle can include a first inverter cell and a second inverter cell. Each of the first inverter cell and the second inverter cell can include at least one transistor device; and a cold plate placed in contact with or proximate to the at least one transistor device. The cold plate can have a coolant channel through the cold plate. The coolant channel can have a coolant inlet at a first side of the cold plate and a coolant outlet on a second side of the cold plate opposite to the first side. The inverter module can include a connector to connect the coolant outlet of the cold plate of the first inverter cell to the coolant inlet of the cold plate of the second inverter cell in series, to form a continuous channel that extends from the first coolant inlet of the cold plate of the first inverter cell into the coolant channel of the cold plate of the second inverter cell. The connector can have one end that mates with the coolant outlet of the cold plate of the first inverter cell, and another end that mates with the coolant inlet of the cold plate of the second inverter cell. The coolant inlet of the cold plate of the first inverter cell can receive coolant fluid into the continuous channel, to cool the first inverter cell and the second inverter cell.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not necessarily intended to be drawn to scale. Like reference numbers and designations in the various drawings indicate like elements. For purposes of clarity, not every component may be labelled in every drawing. In the drawings.

DETAILED DESCRIPTION

Figure 1:
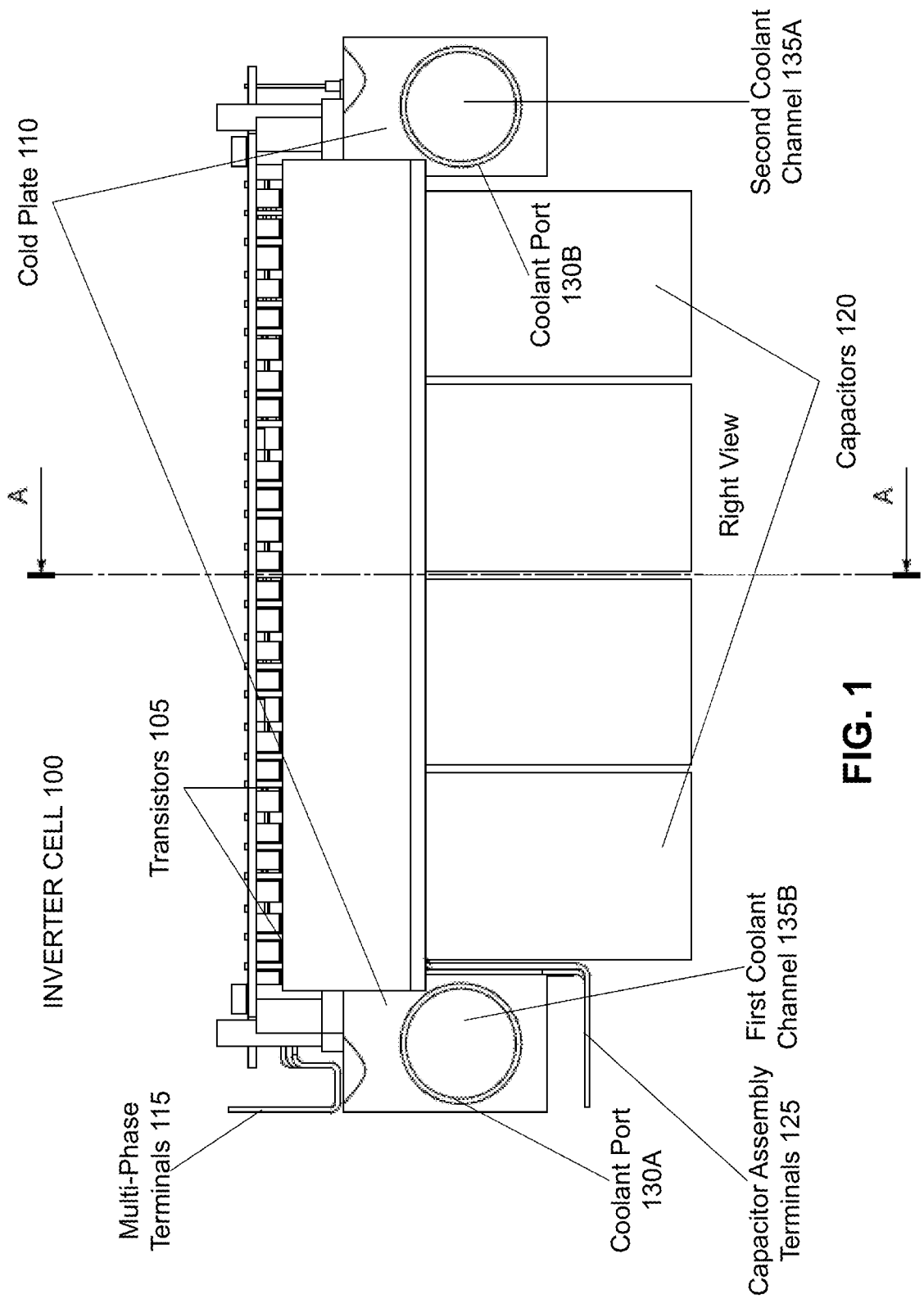
FIG. 1 depicts a side view of an illustrative embodiment of an inverter cell.

Following below are more detailed descriptions of various concepts related to, and implementations of, methods, apparatuses, devices, and systems for providing electrical power. The various concepts introduced above and discussed in greater detail below may be implemented in any of numerous ways. With reference to the FIGS, the systems, methods, devices, and apparatuses of the present disclosure relate generally to devices for providing electrical power, including but not limited to inverter modules.

The present disclosure is directed systems and methods of providing an inverter module which can be incorporated into a power converter component to power a drive unit of an electric vehicle drive system. The inverter module can include multiple inverter cells arranged in various stacked configurations for different electric vehicle drive systems. The various stacked configurations provide continuous channels for coolant flow to transfer heat generated in the inverter cells away from the inverter cells. The inverter module can be coupled with a drive train unit of the electric vehicle and can be configured to provide multi-phase voltages to the drive train unit.

The systems and methods as disclosed herein provide for a scalable inverter module that can be formed using a plurality of stackable or combinable inverter cells. The combinable inverter cells can for example include at least a first inverter cell and a second inverter cell. Each of the combinable inverter cells can include at least one transistor device (e.g., an insulated-gate bipolar transistor (IGBT)) and a cold plate disposed or placed in contact with or proximate to the corresponding transistor device(s), for instance as discussed in connection with at least FIGS. 4A-4C. The cold plate or other heat sink can have a first coolant channel that extends through the cold plate. The first coolant channel can have a first coolant inlet at a first side of the cold plate and a first coolant outlet on a second side of the cold plate. The first coolant outlet of the cold plate of the first inverter cell can, for example, be connected to the first coolant inlet of the cold plate of the second inverter cell, to form a first continuous channel extending from the first coolant inlet of the cold plate of the first inverter cell into the cold plate of the second inverter cell.

One or more additional inverter cells can be connected to the first and second inverter cells in a chain or side-by-side configuration, to extend the first continuous channel for coolant flow. Each of the first and second inverter cells can include an assembly of at least one capacitor mounted proximate to the corresponding cold plate, having a positive terminal and a negative terminal. The positive terminals and negative terminals of the first and second inverter cells can be linked to form a common positive terminal and a common negative terminal for an inverter package comprising the first and second inverter cells. Each of the first and second inverter cells can include an assembly of the at least one transistor device, having a set of multi-phase terminals (e.g., corresponding to between two and six phases). The sets of multi-phase terminals of the first and second inverter cells can be linked to form a single set of multi-phase terminals for the inverter module comprising the first and second inverter cells.

A first connector can be used to connect the first coolant outlet of the cold plate of the first inverter, to the first coolant inlet of the cold plate of the second inverter cell. The connector can have one end that mates with the coolant outlet of the cold plate of the first inverter cell, and another end that mates with the coolant inlet of the cold plate of the second inverter cell. An outlet plug can mate with, and be used to seal the coolant outlet of the cold plate of the second inverter cell.

Each of the cold plates can include one or more channels located proximate to the corresponding transistor device(s), and that can direct coolant flow in a direction that is substantially perpendicular to the first continuous channel. Each of the cold plates can include a second coolant channel through the corresponding cold plate. The second coolant channel can have a second coolant inlet at one side of the corresponding cold plate and a second coolant outlet on an opposite side of the corresponding cold plate. The second coolant channels of the cold plates can be connected to form a second continuous channel that is substantially parallel to the first continuous channel. Each of the cold plates can include one or more channels proximate to the corresponding at least one transistor device. The one or more channels can direct coolant flow between the first continuous channel and the second continuous channel. One end of the first continuous channel can allow inflow of coolant for circulation through the cold plates and one end of the second continuous channel can allow outflow of the coolant from the inverter cells.

There is an increasing demand for reliable and high performance inverters of different power ratings, to support applications in plug-in hybrid electrical vehicles (PHEVs), hybrid electrical vehicles (HEVs), electrical vehicle (EV), or other automotive or non-automotive systems, for example. Conventional automotive inverters are typically custom-assembled from off-the-shelf, modularized components (IGBTs, capacitors, etc.) selected from a range of available components. However, this approach does not allow for flexibility of certain parameters, such as inverter package dimensions and power rating or performance, which are limited by the availability of the off-the-shelf modular components. Off-the-shelf IGBT modules and their module-specific auxiliary components can be used as components. However, by using modular components such as these to custom-build inverters, inverter performance is only as variable as the module manufacturers' portfolios.

Such discrete electrical components can be packaged into complete inverters. The power ratings of such inverters can be customized to a limited extent as discussed above, and can be determined by the number of discrete devices paralleled together for instance. However, this approach can require significant engineering rework to modify the power rating (e.g., with each change in the inverter specification), rather than simply linking or removing a component inverter cell as in the case of the inverter cell and inverter module concepts disclosed herein.

The present systems and methods offer a solution of a highly modularized, stackable and combinable inverter cell, and a scalable inverter architecture and package that can use or incorporate one or more of such inverter cells in an inverter module to meet the power rating requirement of any vehicle or automotive platform, for example. Each of the inverter cells can contain all necessary circuitry and inputs and outputs (I/Os) to function or operate as a stand-alone inverter (e.g., a low-power inverter for a golf cart application). Multiples of the inverter cells can be combined, connected or stacked, to share common I/O(s), and to function as a single, higher-power inverter (e.g., for a sports car application). This inverter architecture can allow for a single mass-produced or modularized inverter cell to be used as a building block, for flexibility in assembling inverter packages that can satisfy a wide range of applications and platforms, thereby driving down costs and time-to-market across the OEM's product portfolio.

FIG. 1, among others, depicts a side view of an example inverter cell 100. The inverter cell 100 can include a cold plate 110, one or more transistor devices 105 (sometimes referred to herein as "transistors"), and one or more capacitors 120. The cold plate 110 can include one or more coolant channels 135A, 135B for circulating coolant fluid to transfer heat out of the invertor cell (e.g., heat generated by the transistor devices and capacitors). The inverter cell 100 can include an inverter circuit with electrical input and output (I/O), and the inverter cell's own dedicated cold plate 110. As an example, an inverter cell 100 can be formed having a length of about 220 mm to about 230 mm, a width of about 80 mm to about 90 mm and a height of about 60 mm to about 70 mm. The dimensions and size of the inverter cells 100 described herein can vary outside these ranges.

The inverter cell 105 can be implemented using one or more discrete transistor devices 105 and one or more discrete capacitors 120, for instance. The electrical I/O can include direct current (DC) link bus bar(s) and capacitor assembly terminals 125 (e.g., terminals for an assembly of the capacitors 120). The electrical I/O can include multi-phase (e.g., 3-phase, 6-phase) bus bars or terminals 115 (e.g., terminals for an assembly of the transistor devices 105). An inverter cell 105 can be formed in a variety of different shapes. For example, and as depicted in FIG. 1, the inverter cell 105 can have a rectangular shape.

Figure 6:
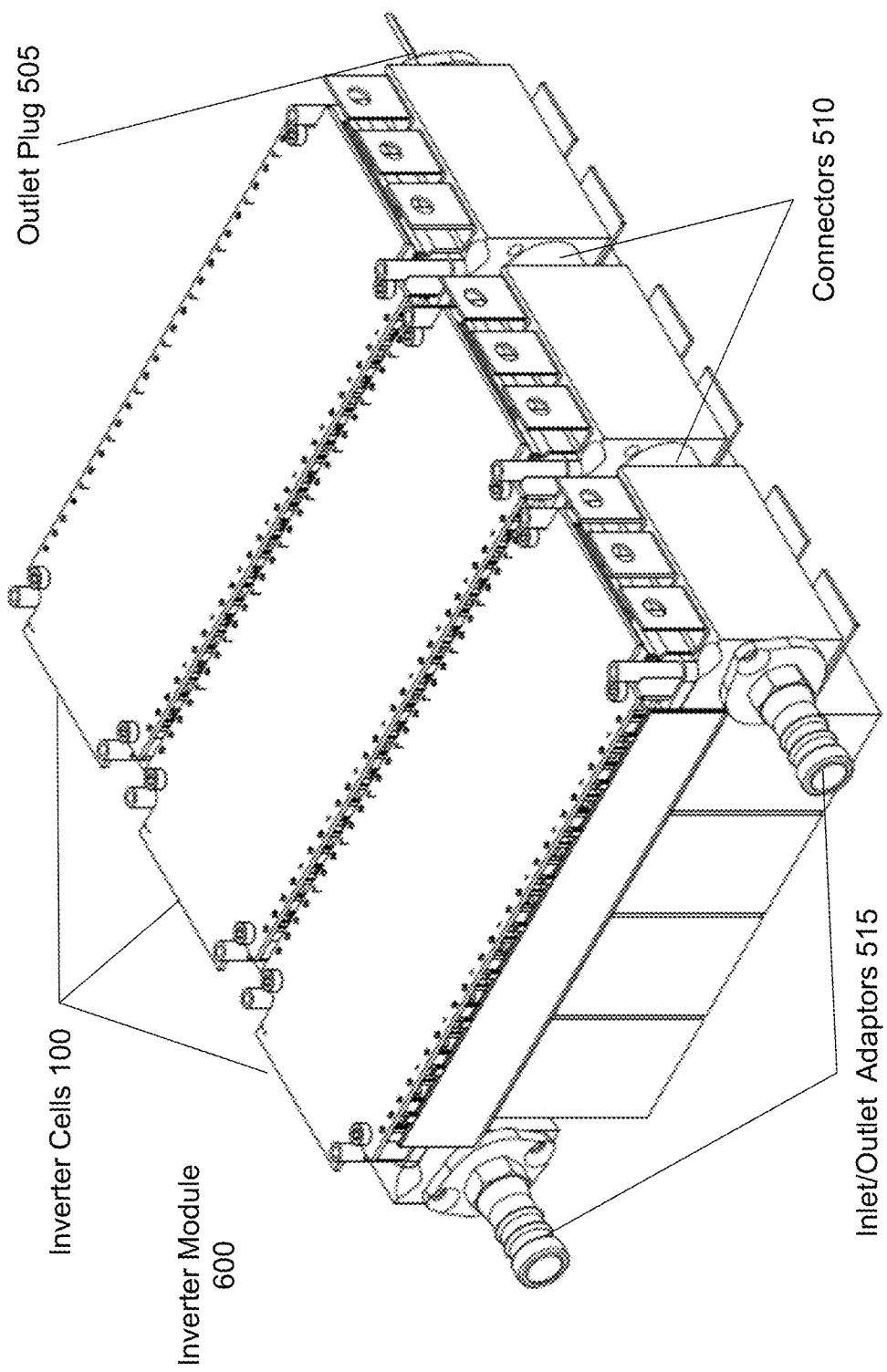
FIG. 6 depicts an isometric view of an example configuration of inverter cells connected in parallel.

Such inverter cells 100 can be purpose-built to be combinable or stackable to form an inverter module 600 of a desired configuration (e.g., a specific power rating, performance, or set of package dimensions), for instance as illustrated in FIG. 6 with three inverter cells 100. The three inverter cells 100 can be formed and arranged within an inverter module in a triplet configuration to provide a compact design for example. However, any number of inverter cells can be linked in parallel for instance, multiplying power rating whilst maintaining common electrical and coolant I/O. The inverter cells 100 can be positioned such that their respective input terminals and output terminals are aligned. The alignment of the input terminals and output terminals can allow one or more bus-bars coupled with each of the inverter cells 100 to be disposed adjacent and parallel to each other.

The inverter cells 105 can be formed to be modular units having similar shapes, sizes, and dimensions such that they can interchangeable within an inverter module 600. Thus, individual inverter cells 105 can be replaced, serviced or otherwise repaired without replacing an entire inverter module 600. Some or all of the inverter cells 105 in a common inverter module 600 may have the same shape, size, and dimensions. These inverter cells 100 can use discrete transistor devices 105 and capacitors 120, which is a departure from most of the EVs currently on the market.

As further illustration of how the inverter cells 100 are combinable, the coolant inlet port 130A and coolant outlet port 130B of each inverter cell 100 can be positioned, oriented or otherwise placed, such that two side-by-side inverter cells 100 can form common coolant inlet and outlet channels 135A, 135B. The electrical I/O of multiple inverter cells 100 can be joined by auxiliary printed circuit boards (PCBs), bus bars, or other structural components specific to a desired configuration (e.g., for a particular vehicle platform).

By way of illustration, an engineer developing a vehicle-specific inverter module can use the inverter cells 100 as a basis for the inverter module's design. The engineer can determine the number of inverter cells 100 to be used in order to meet the vehicle power requirement. The inverter cells 100 can be stacked side-by-side, for example, to form the core of the inverter module. The engineer can design, use or select auxiliary coolant fittings, structural components, and bus bars to mechanically and electrically link the inverter cells 100 together. As such, a new, vehicle-specific inverter module can be produced using the modularized inverter cells 100.

The modularized inverter cells 100 described herein can provide scalability of inverter circuitry to meet various requirements, while providing adequate cooling. The latter can be achieved because each inverter cell 100 is designed and implemented with its dedicated cold plate 110 that can support the per-cell power rating or performance of the inverter cell 100. Therefore, any combination of the inverter cells 100 to provide increased overall power and performance would not exceed the per-cell cooling specifications. By using the modularized inverter cell 100 to implement inverter modules, time to market for new platforms or vehicles can be reduced, since the same inverter cells 100 can be reused in new designs. Manufacturing and engineering costs can be reduced, since the same core design and manufacturing lines of the inverter cells 100 can be maintained. Design flexibility can be maximized, since power ratings and package sizes can be determined internally by each inverter package development team, rather than being driven by the (e.g., limited) availability of off-the-shelf modularized components.

The inverter cell 100 can include a cold plate 110. The cold plate 110 can include one or more coolant ports 130. For example, a first coolant port 130A can be formed through an outer surface of the cold plate 110 at a first side and a second coolant port 130B can be formed through the outer surface of the cold plate 110 at a second, different side. The coolant ports 130 can be formed as orifices or holes formed on and through the outer surface 130 of the cold plate 110. The coolant ports 130 can be fluidly coupled with each other through one or more channels, tubes or conduits disposed within the cold plate 110 or an inverter cell 100 that the cold plate 110 is disposed within. The coolant ports 130 can be fluidly coupled with one or more coolant passages or coolant channels formed within the cold plate 110 such that coolant fluid can be provided to the coolant channels 135 within the cold plate 110 through the coolant ports 130.

The cold plate 110 can include multiple coolant ports 130. For example, using FIG. 1 for illustration, a first coolant port 130A can correspond to a coolant input port or manifold configured to receive coolant fluid and provide the coolant fluid to the cooling channels 135A, 135B. A second coolant port 130B can correspond to a coolant output port or manifold configured to release the coolant fluid from the cooling channels 135A and 135B. Some coolant ports 130 can be formed on opposing sides of the cold plate 110, and some coolant ports 130 can be formed on the same side of the cold plate 110.

The cold plate 110 can include a first coolant channel 135A that extends from a coolant port (e.g., functioning as a coolant inlet, not shown) on one side (e.g., a left side) of the cold plate 110, to a coolant port 130B (e.g., functioning as a coolant outlet) on another side (e.g., a right side) of the cold plate 110. The cold plate 110 can include a second coolant channel 135B that extends from a coolant port 130A (e.g., functioning as a coolant inlet) on one side (e.g., a right side) of the cold plate 110, to a coolant port (e.g., functioning as a coolant outlet, not shown) on another side (e.g., a left side) of the cold plate 110, for example.

A coolant port 130 functioning as a coolant inlet can include or correspond to an orifice or hole configured to receive coolant fluid and to provide the coolant fluid to the inverter cell 100 to provide cooling for the inverter cell 100. A coolant port 130 functioning as a coolant outlet can include or correspond to an orifice or hole configured to release coolant fluid from the inverter cell 100 to remove heat generated from within the inverter cell 100 and transferred onto the coolant fluid being released. The coolant fluid provided into the coolant port(s) 130 can flow through the cold plate 110 and is sealed or maintained within the cold plate 110 such that the cold plate 110 can provide cooling to electronics (e.g., transistor devices 105 and capacitors 120) of a inverter cell 100 the cold plate 110 is disposed within.

The inverter cell 100 can include one or more transistor devices 105. The transistor devices 105 can include a variety of different transistors. The transistor device 105 can include a semiconductor device having one or more connections. For example, the transistor device 105 can include a base terminal, a collector terminal, and an emitter terminal. Each of the transistor devices 105 can include one or more leads. For example, each of the transistor devices 105 may include three leads. Each of the three leads can corresponds to at least one of the terminals of the transistor device 105. For example, a first lead can correspond to the base terminal or base lead. A second lead can correspond to the collector terminal or collector lead. A third lead can correspond to the emitter terminal or emitter lead. The leads can receive or provide a voltage signal or a current signal. The transistor device 105 can be incorporated into the inverter cells 100 described herein.

Each of the one or more transistor devices 105 can include or correspond to an IGBT or any other form of type of transistor, such as a field-effect transistor or FET based transistor (e.g., metal-oxide-semiconductor FET (MOSFET)), a bipolar junction transistor (BJT) based transistor, a silicon carbide based transistor, or otherwise. By way of example, the transistor device 105 can include a TO-247 transistor or a TO-247 discreet IGBT package. The transistor devices 105 can have multi-phase terminals or single-phase terminals. The inverter cell 100 can include any number of transistor devices 105, such as 9, 18, 24 or other number. Each inverter cell 105 can be formed having a length ranging from 200 mm to 240 mm, a width ranging from 70 mm to 100 mm, and a height ranging from 50 mm to 80 mm. The dimensions and size of the three inverter cells 105 described herein can vary outside these ranges.

The inverter cell 100 can include one or more capacitors 120. Each of the one or more capacitors 120 can include or correspond to a DC-Link, Single-Phase (DCLSP) capacitors. The capacitors 120 can be used as decoupling or "x" capacitors, or DC-Link filtering capacitors. The capacitors 120 can include any form or type of capacitor used in automotive, industrial or commercial inverters. Each capacitor 120 can include one or more filtering capacitor film elements. Each of the one or more capacitors 120 can have a capacity of the same or different values, such as 100 Farads or other value(s). The inverter cell 100 can provide a closed inductance loop between one or more capacitors 120 and one or more transistor devices 105. The lead(s) of one or more transistor devices 105 can be connected, and terminated to or otherwise coupled with lead(s) of one or more capacitors 120 through resistive welding for instance.

Figure 2:
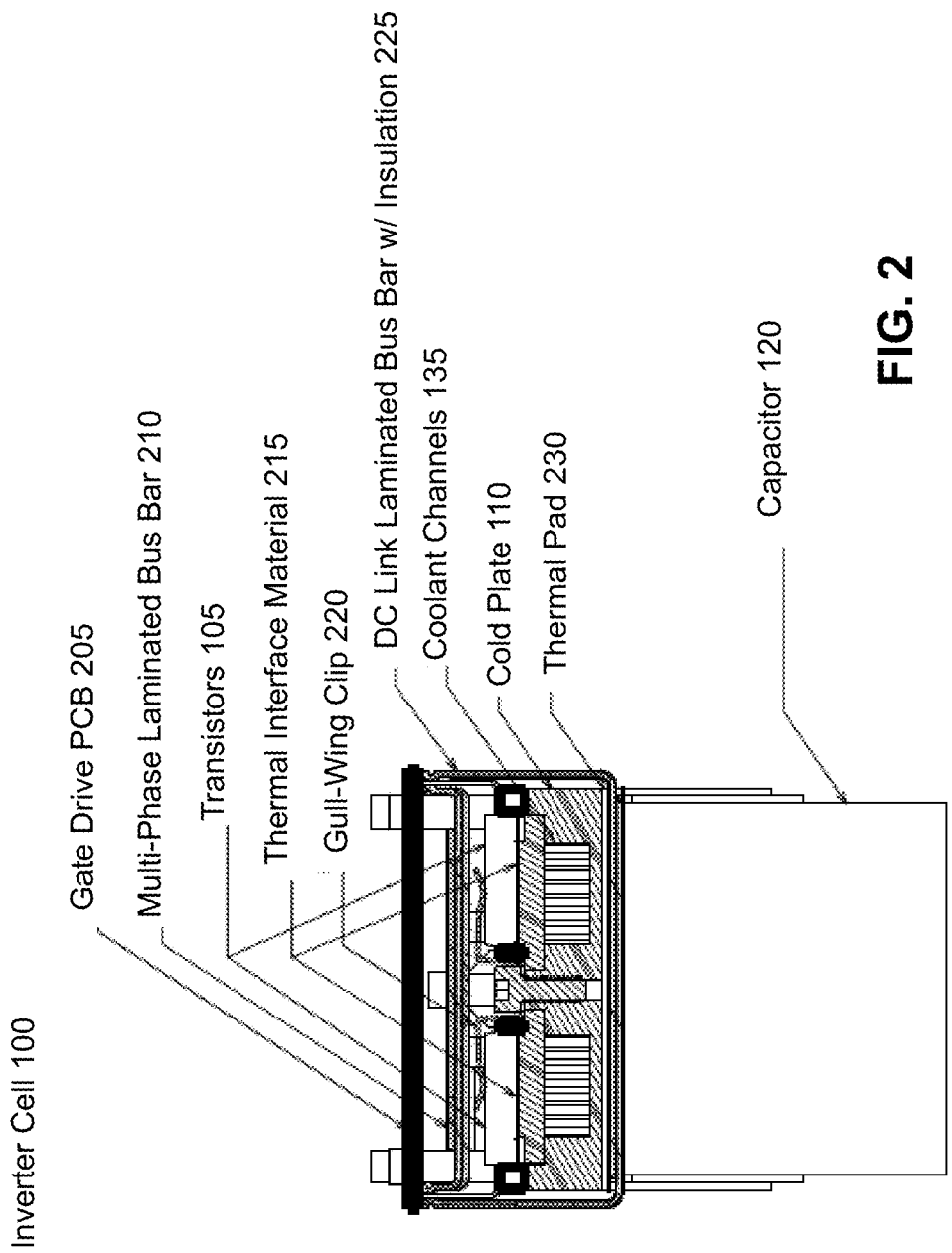
FIG. 2 depicts a cross-sectional view of an illustrative embodiment of an inverter cell.

FIG. 2, among others, depicts an illustrative cross-sectional view of an inverter cell 100 in the plane A-A indicated in FIG. 1 for instance. The inverter cell 100 can include a gate drive printed circuit board (PCB) 205, multi-phase laminated bus bars 210 for connecting the multi-phase terminals (or extending the single-phase terminals) of the transistor devices 105, and thermal interface material (TIM) 215 (e.g., ceramic-based, incorporating Aluminum Nitride for instance) for facilitating thermal conduction of heat away from the transistor devices 105. The gate drive PCB 205 can include circuitry (e.g., level shifter in combination with an amplifier) for taking a low-power input (e.g., transistor switching signal) from controller circuitry (which can be incorporated on the gate drive PCB) and producing a high-current drive input for the gate of the one or more transistor device 105 to control or speed-up transistor switching. The inverter cell 100 can include one or more gull wing clips 220 for holding or supporting the transistor device 105 in place within the inverter cell 100. The inverter cell 100 can include a DC link laminated bus bar with insulation 225, for interconnecting the capacitors 120.

Figure 3:
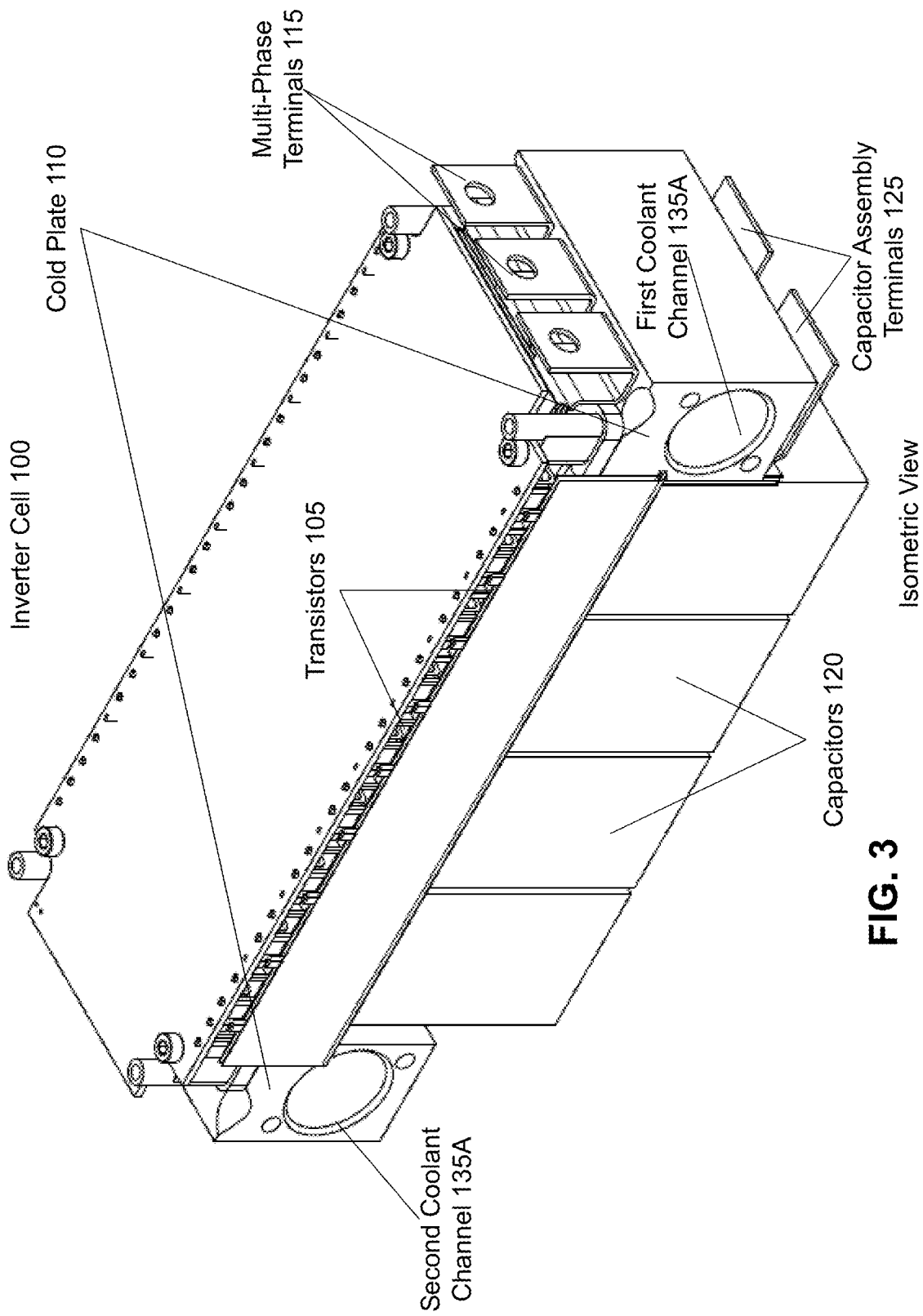
FIG. 3 depicts an isometric view of an illustrative embodiment of an inverter cell.

The cold plate 110 can include a plurality of cooling channels 135 or passages in which coolant fluid can by pumped or otherwise provided through. The cooling channels 135 can be formed within the cold plate 110 such that they are positioned proximate to or within a predetermined distance from the plurality of transistors devices 105 and the capacitor(s) 120. The cold plate 110 can include aluminum or an aluminum heat sink. The cold plate 110 can include one or more different structural layers or one or more different materials. The different structural layers of the cold plate 110 can be formed into a single layer during manufacture, such as by friction stir weld construction. The inverter cell 100 can include one or more thermal pads 230 for facilitating heat transfer from the capacitors 120 towards the cold plate 110. FIG. 3, among others, depicts an illustrative isometric view of an inverter cell, including some of same elements discussed in connection with at least FIGS. 2 and 3.

Figure 4A:
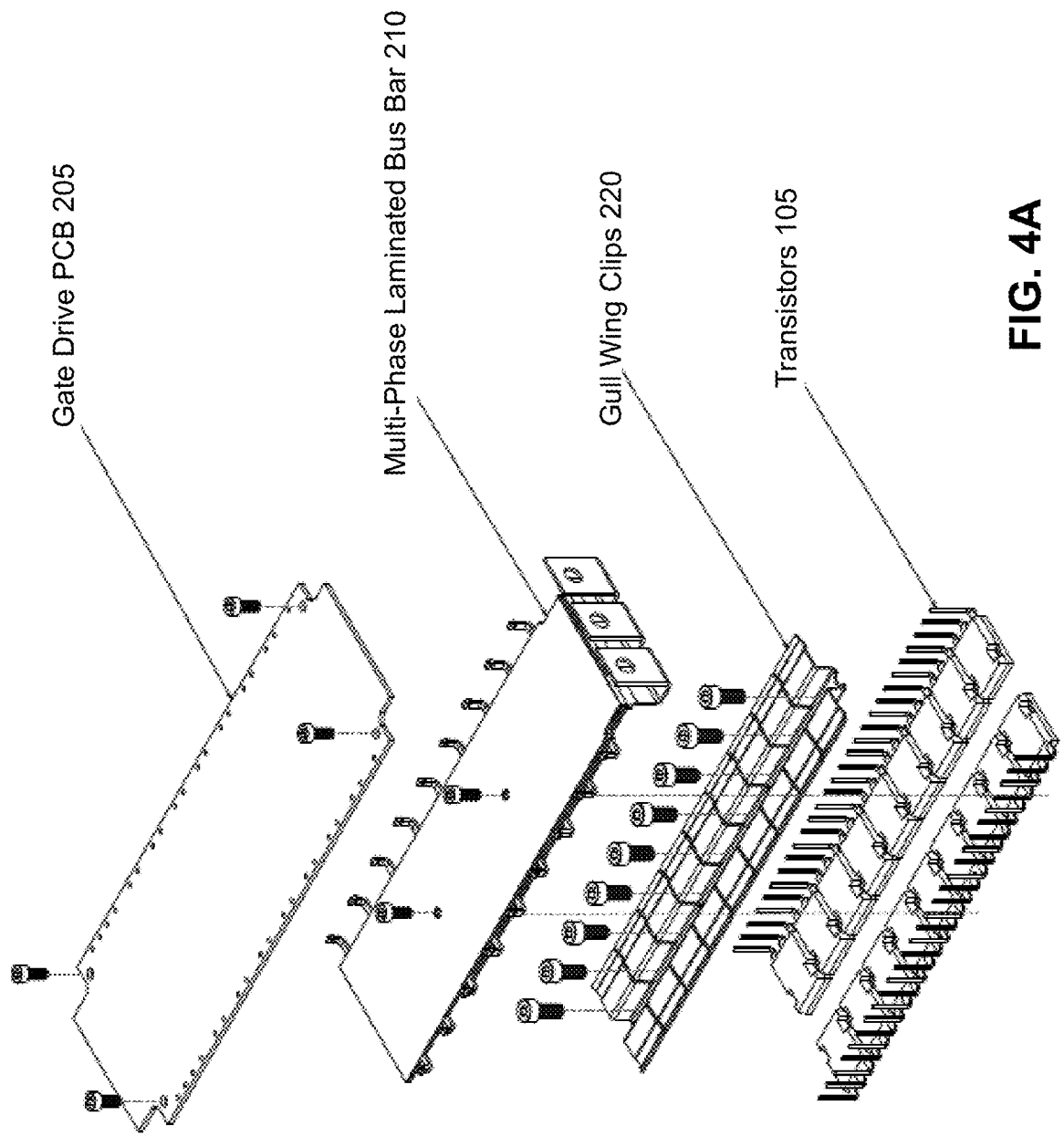
FIGS. 4A-4C depict an exploded view of an illustrative embodiment of an inverter cell.
Figure 4B:
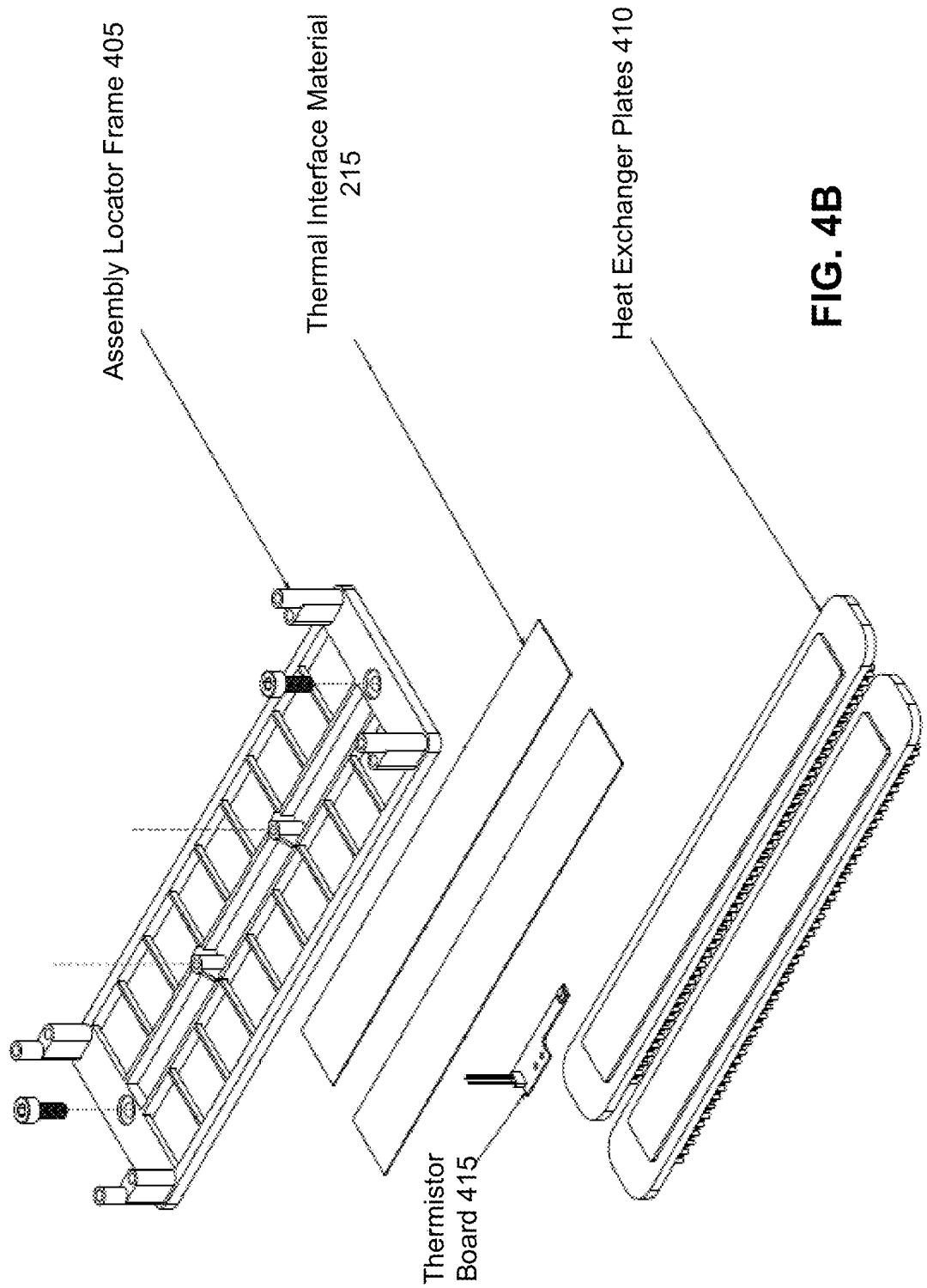
Figure 4C:
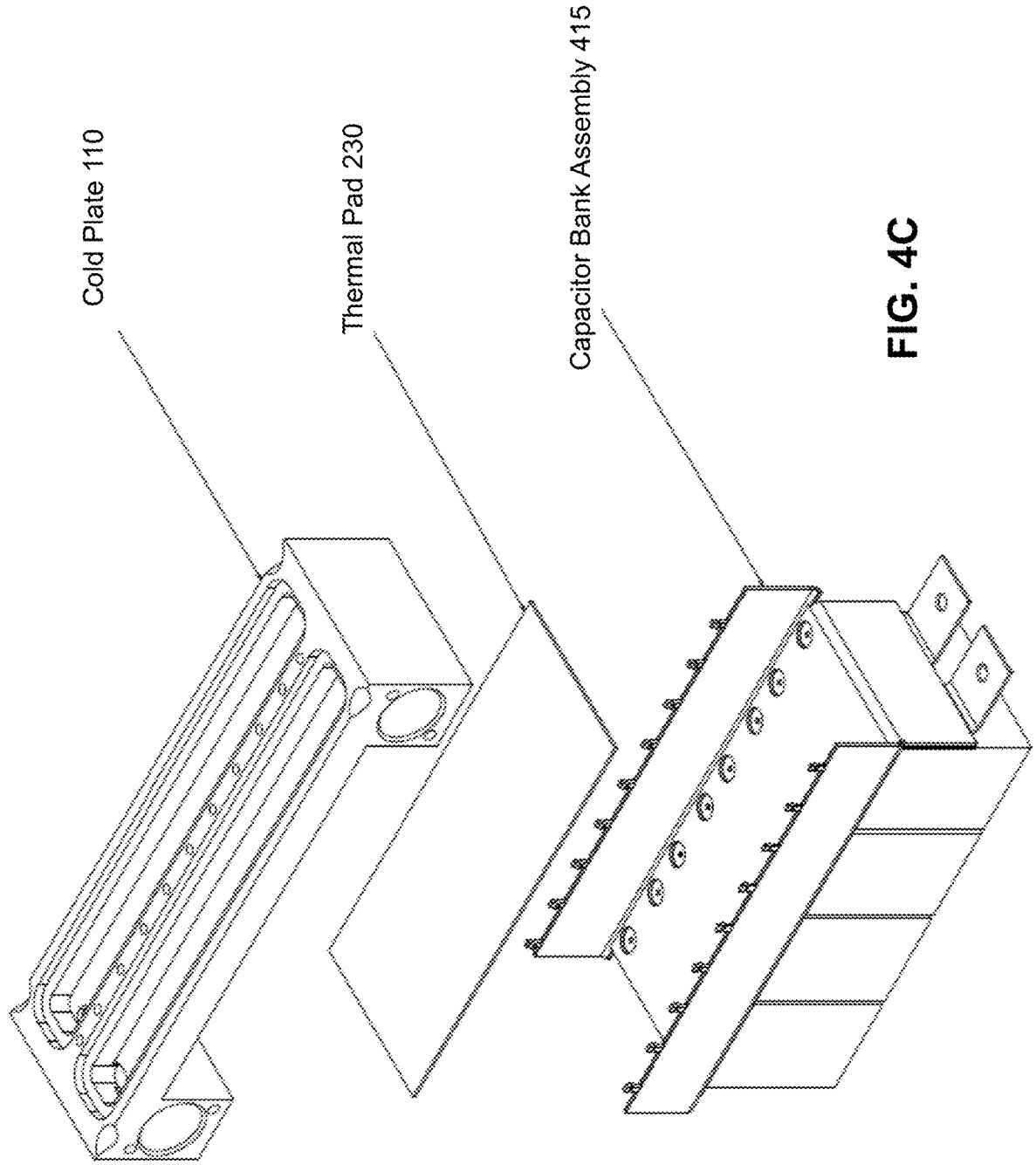

FIGS. 4A-4C, among others, provide an illustrative exploded view illustrating the relationship, order of assembly, or alignment of the different components that form an example inverter cell. The components shown in FIG. 4A are stacked above those shown in FIG. 4B, and those shown in FIG. 4B are in turn stacked above those shown in FIG. 4C. For example, the inverter cell 100 can have a gate drive PCB 205 as an upper layer, which is mounted above a multi-phase laminated bus bar 210 (e.g., three-phase laminated bus bar) as shown in FIG. 4A. The multi-phase laminated bus bar 210 can include 2 or more laminated layers of conductors. For instance, three layers can be used for connecting to a respective one of three types of transistor device (e.g., IGBT) terminals, and extended out to form three corresponding terminals from one end or edge of the laminated bus bar 210. A plurality of gull wing clips 220 can be installed using fasteners below the laminated bus bar 210, to clip, fasten or hold a plurality of transistor devices 105 in place in the inverter cell 100.

FIG. 4B, among others, shows an example configuration of an inverter cell in which an assembly locator frame 405 is used to further provide support or hold the plurality of transistors 105 in place. In addition, TIM 215 can be used below the transistor devices 105 or assembly locator frame 405, to facilitate heat transfer from the IGBTs 105 to heat exchanger plates 410. The inverter cell 100 can include a thermistor board 415, which can include thermistor circuitry that can sense temperature (and temperature changes), and can trigger adjustments to the coolant flow or operation of the inverter cell components (e.g., cease operation in some or all transistor devices). The heat exchanger plates 410 can be welded or otherwise mounted or fastened to a cold plate 110.

FIG. 4C, among others, illustrates the cold plate 110 which is placed above a thermal pad 230 for transferring heat from a capacitor bank assembly 415 to the cold plate 110. The capacitor bank assembly can include a DC laminated bus bar, for interconnecting a plurality of capacitors 120, and for providing a pair of DC terminals for the whole capacitor bank assembly.

The inverter cell can include at least one transistor (e.g., an insulated-gate bipolar transistor (IGBT)) 105 and a cold plate 110 disposed or placed in contact with or proximate to the corresponding transistor(s) 105. By way of a non-limiting example (and referring to FIGS. 4A-4C for instance), a gull wing clip 220 can extend out and over at least a first transistor 105 and a second transistor 105. The gull wing clip 220 can compress or otherwise hold the first and second transistors 105 in place and against TIM 215 (e.g., a ceramic layer) disposed between the first and second transistors 105 and the cold plate 110 so that the transistors 105 and the cold plate 110 are proximate to each other. For example, the gull wing clip 220 can be positioned to compress the first and second transistors 105 towards the cold plate 110 to increase the cooling provided by the cold plate 110.

A plurality of transistors 105 can for example be coupled with or otherwise disposed in slots of an assembly locator frame 405 (which can also be referred to herein as a locator guide or locator). A first TIM 215 pad (e.g., thermal pad) can be coupled with one portion of the locator 405 and a second TIM 215 pad can be coupled with another portion of the locator 405. The first and second TIM pads 215 can be coupled with the same side or surface of the locator 405 such that the transistors 120 are disposed against the first and second TIM pads 215.

A plurality of gull wing clips 220 (sometimes referred herein generally as clips) can couple the transistors 105 with the locator 405 (e.g., to be proximate to or in contact with the cold plate 110). Each of the clips 220 can includes at least two gull wing portions extending out from a center portion of the respective clip 220 and over at least one of the plurality of transistors 105. For example, the gull wing portions can compress and hold the transistors 105 in place and in contact with the locator 405. The clips 220 can include gull wing portions that extend out and over a surface (e.g., top surface) of the transistors 105 to secure the transistors 105 and compress the transistors 105 towards the TIM 215 and (e.g., proximate to) the cold plate 110. For example, the cold plate 110 includes a plurality of cooling channels 135 having coolant fluid flowing through, and the gull wings clips 220 can compress the transistors 105 closer to the cooling channels 135 to increase the cooling provided by the cooling channels 135 and the cold plate 110. The TIM 215 can be disposed between the transistors 105 and the cold plate 110 to electrically insulate the transistors 105 from the cold plate 110.

The inverter cell 100 can be designed or implemented so that transistors (e.g., insulated-gate bipolar transistors (IGBTs)) 105 and a cold plate 110 within the inverter cell 100 can be proximate to each other. For example, the shape of the locator 405 can position the cold plate 110 to a closer distance (e.g., proximity) or within a predetermined distance to components (e.g., including transistors 105) within an inverter cell 100. The cold plate 110 can be close to the transistors 105 but not in direct contact with the transistors 105. For example, the cold plate 110 can be spaced from the transistors 105 a distance in a range from 0.25 mm to 1 mm (e.g., less than 1 mm), or other range such as 0.5 mm to 2 mm. The cold plate 110 can be separated from the transistors 105 by a sheet of ceramic material having a thickness or width of less than 1 mm for instance. For instance, a transistor 105 can be in contact with one side or surface of the sheet of ceramic material (e.g., TIM 215), and the cold plate 110 can be in direct contact with another side or surface of the sheet of ceramic material, as illustrated in FIGS. 4A and 4B for example. The locator 405 can align the transistor 105 for direct contact with the sheet of ceramic material for example. For example, the plurality of cooling passages 135 having coolant fluid provided to or flowing through can be positioned in a closer proximity to cool the different electronics (e.g., transistors 105) or other components of an inverter cell 100.

By way of example, the locator 405 can include two (or other number of) slots for the TIM 215 pads, eighteen (or other number of) transistor slots (or IGBT slots), nine (or other number of) slots for the clips 220, and a slot for a thermistor board 415. The slots for the TIM 215 pads can have a generally rectangular shape which can be selected based on the shape of the particular thermal pad to be used in the inverter cell 100. The transistors slots can have a generally rectangular shape which can be selected based on the shape of the particular transistors to be used in the inverter cell 100. The slots for the clips 220 can have a generally elongated shape or rail to couple with a threaded portion of a clip 220. The slot for the thermistor board 415 can have a generally round shape, rectangular shape, or other shape conformed to that of the thermistor board 415.

Figure 5A:
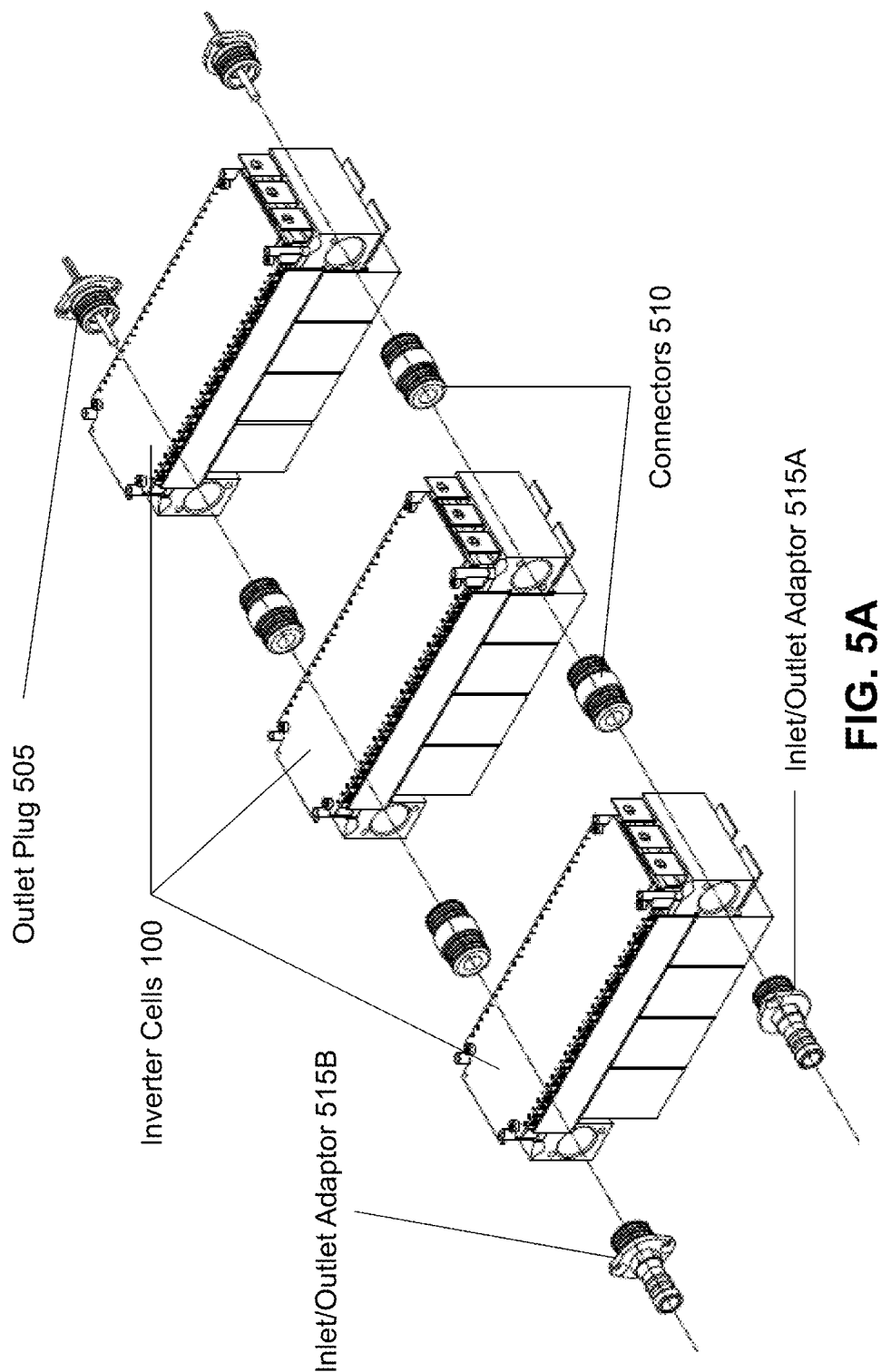
FIG. 5A depicts an example configuration of inverter cells for connecting in parallel.

The inverter cell 100 can be combinable or stackable to form an inverter of a desired configuration. FIG. 5A, among others, shows an example configuration of inverter cells that can be connected in parallel to provide higher power, horsepower or current. Although three inverter cells are shown in this example, a different number of inverter cells can be connected together to form an inverter circuit for a particular specification. Connectors 510 can be used to connect between coolants inlets and outlets of adjacent inverter cells.

Figure 5B:
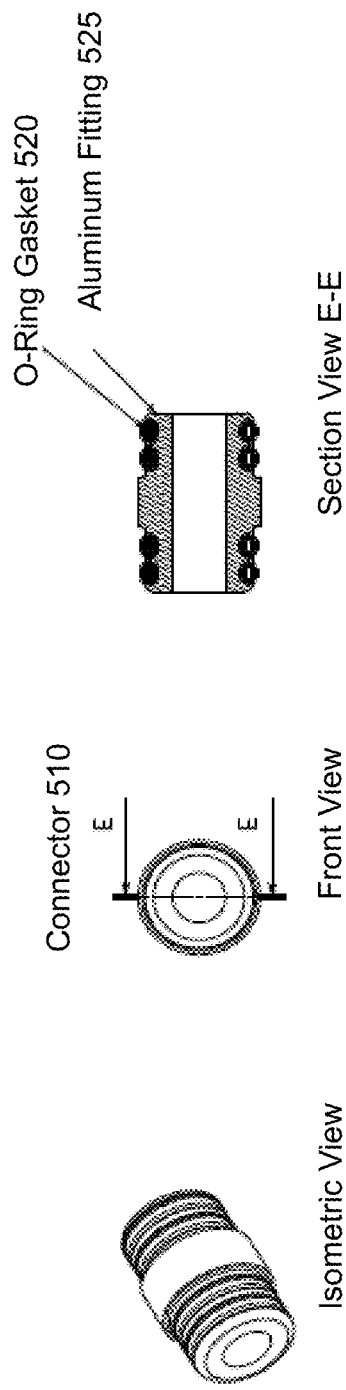
FIG. 5B depicts various views of an illustrative embodiment of a connector and an illustrative embodiment of an inlet/outlet adapter.
Figure 5B:
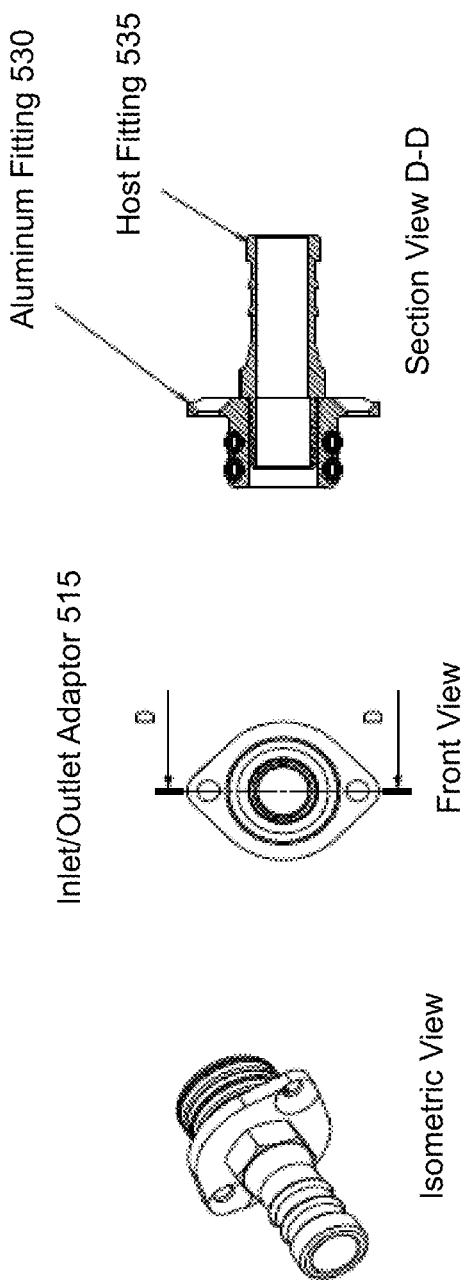

For instance, and as shown in FIG. 5B, among others, a connector 510 can comprise an aluminum (or other metal or material) fitting 525, with a shape that conforms to the shape of an inverter cell's coolant inlet or outlet (e.g., coolant port 130). The connector 510 can be cylindrical in shape (or other shape) and can include two ends, each mate-able with a coolant inlet/outlet (e.g., coolant port 130) of a corresponding cold plate 110, so that when mated or connected, the coolant inlets/outlets and the connector 510 are aligned to share a common axis and can form a continuous channel extending between a corresponding pair of inverter cells 100 arranged side-by-side with each other. The connector 510 can have one or more O-ring gaskets 520 fitted at each end of the connector 510 to provide a leak-proof seal or connection between two inverter cells 100.

At least one connector 510 may be integrated as part of a coolant inlet/outlet (e.g., coolant port 130) of a cold plate 110, such that a protruding part of the connector 510 can mate or connect to a coolant inlet/outlet of another cold plate 110. For instance, connectors 510 can consistently be located on one predetermined side of inverter cells 100, to be connected to coolant inlets/outlets of other inverter cells 100 located on an opposite side.

In a chain of connected inverter cells 100, a first of the inverter cells 100 can have at least one coolant inlet (e.g., coolant port 130A or 130B) being designated as a common or sole coolant inlet for the interconnected chain of inverter cells 100 (or inverter module 600). As shown in the example configuration of FIG. 5A, the first (or left-most) inverter cell 100 also has a coolant outlet (e.g., coolant port 130A or 130B) designated as a common or sole coolant outlet for the interconnected chain of inverter cells 100 (or inverter module 600). The designated inlet(s) or outlet(s) can be fitted with inlet/outlet adapters 515.

For instance, and as shown in FIG. 5B, an inlet/outlet adapter 515 can comprise an aluminum (or other metal or material) fitting 530, with one end that conforms to the shape of an inverter cell's coolant inlet or outlet (e.g., coolant port 130). The inlet/outlet adapter 515 can in part be cylindrical in shape (or other shape) and can include one end that is mate-able with a coolant inlet/outlet of a corresponding cold plate 110. This end can be fitted with one or more O-ring gaskets to provide a leak-proof seal or connection to the inverter cell 100. The inlet/outlet adapter 515 can have an opposite end comprising a host fitting 535 mate-able with a hose for transporting coolant in/out of a corresponding cold plate.

The host fitting 535 operating as a coolant inlet can include a hose barb and can be shaped and implemented to receive or couple with a hose, tube, or conduit to receive coolant and provide the coolant fluid to the inverter module 600. The host fitting 535 operating as a coolant outlet can include a hose barb and be shaped and implemented to receive or couple with a hose, tube, or conduit to release coolant fluid from the inverter module 600.

FIG. 5A, among others, further shows an example in which a last of the chain of inverter cells 100 has two coolant inlet/outlet openings (e.g., coolant ports 130) located at the far end of the chain being sealed with outlet plugs 505, so that the coolant fluid flows towards and out of the common or designated outlet. Other configurations of the locations of outlet plugs 505 and inlet/outlet adapters 515 can be used, for example depending on the cold plates' coolant channel design, to allow for efficient or balanced heat transfers across the cold plates 110. One or more of the outlet plugs 505 can include or incorporate a sensor device. The sensor device can include a sensor rod extending into the coolant fluid for instance (or other structure or mechanism) that can be used to sense, monitor, or measure (or collect data about) an aspect or characteristic of the coolant fluid or coolant channel. For example, the sensor device can be temperature sensitive, and can be used to measure or determine a temperature of the coolant fluid at a certain time.

The sensor device can be connected, e.g., communicatively or electrically, to a device that uses data collected by the coolant sensor device, to calculate or determine an aspect or characteristic of the coolant or coolant channel (e.g., temperature). For example, to support or compensate for a less effective heat transfer in the last of the chain of inverter cells, the cold plates 110 can be over-designed, or a limit can be placed on the maximum number of inverter cells that can be chained or connected in parallel.

Figure 8:
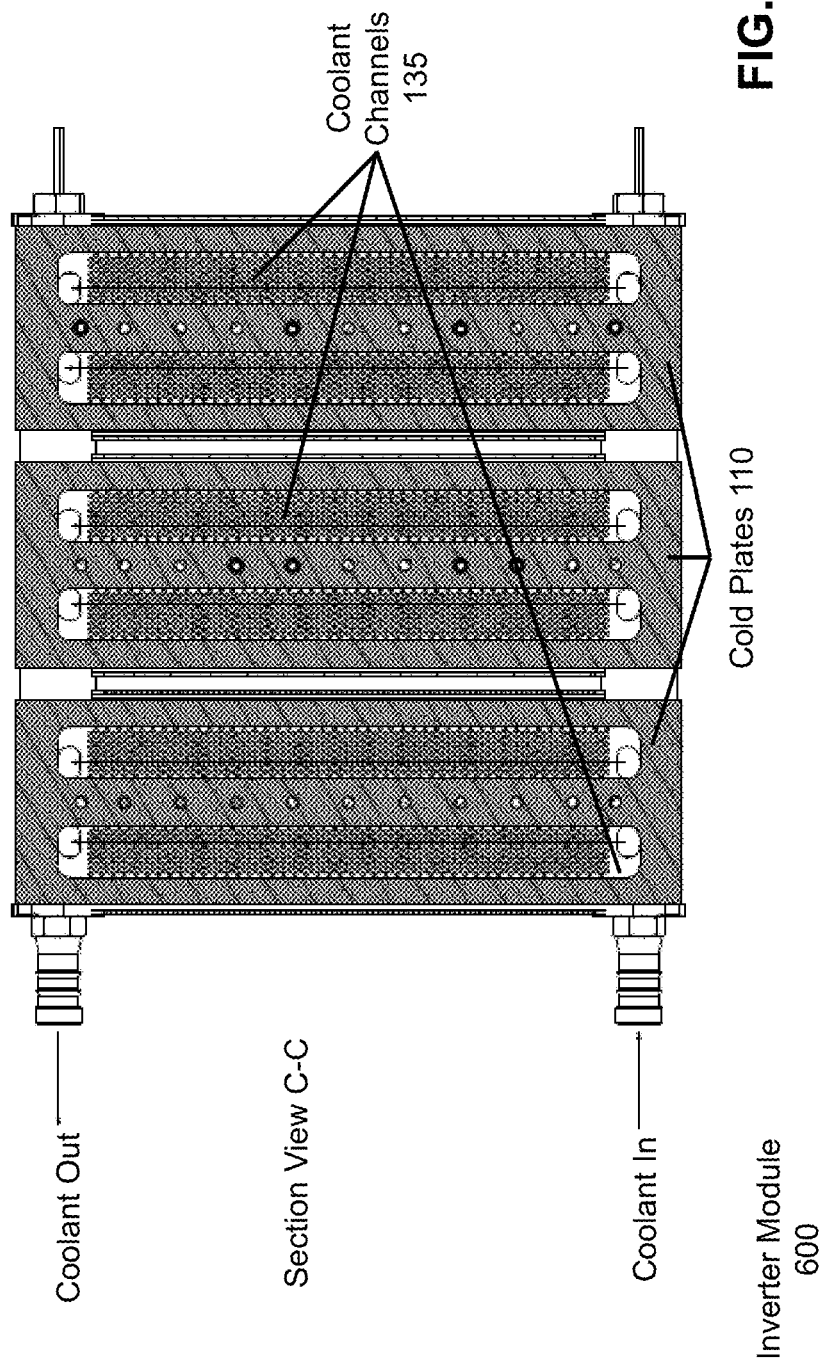
FIG. 8 depicts a front view and a cross sectional view of an illustrative embodiment of connected inverter cells.
Figure 8:
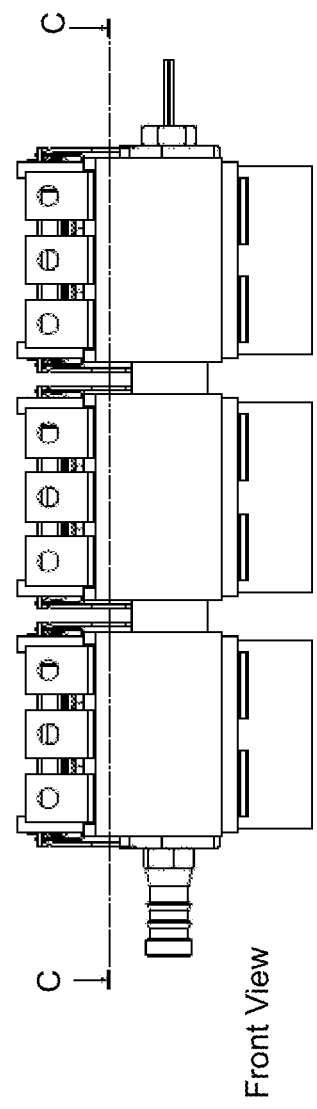

By way of an example, an inlet/outlet adapter 515A (e.g., in FIG. 5A) coupled to a first coolant port 130A may correspond to an inlet to receive coolant fluid (or an outlet port to release coolant fluid). An inlet/outlet adapter 515B coupled to a second coolant port 130B may correspond to an outlet port to release coolant fluid (or an inlet port to receive coolant fluid). The coolant ports 130 can be formed as orifices or holes formed on or through the surface of the cold plate 110. The coolant ports 130 can be fluidly coupled with each other through tubes, conduits, or channels formed in or disposed within the cold plate 110 or an inverter cell 100 that the cold plate 110 is disposed within. The coolant ports 130 can be fluidly coupled with one or more coolant passages or channels 135 (as shown in FIGS. 2 and 8) formed within the cold plate 110 such that coolant fluid can be provided to the cooling channels 135 within the cold plate 110 through the coolant ports 130.

FIG. 6, among others, shows an example inverter module 600. The inverter module 600 can include a chain of three inverter cells 100 connected together with connectors 510, and fitted with inlet/outlet adapters 515 at one end of the chain, and outlet plugs 505 at another end of the chain. As illustrated, the three inverter cells 105 are disposed in a triplet configuration to form the inverter module 600. The three inverter cells 105 can be disposed adjacent with respect to each other. For example, the inverter cells 105 can be positioned such that a first side surface of a first inverter cell 105 is adjacent to a first side surface of a second inverter cell 105 and a second side surface of the second inverter cell 105 is adjacent to a first side surface of a third inverter cell 105. The inverter cells 105 can be disposed in other arrangements within the inverter module 600. The inverter cells 105 can be disposed in a triplet configuration to provide a compact size of the inverter module 600

As depicted in FIG. 6, the inverter module 600 can be formed having a substantially rectangular shape. However, the inverter module 600 can be formed in a variety of different shapes or having different dimensions. The particular shape or dimensions of the inverter module 600 can be selected based at least in part on the shape and dimensions of the inverter cells 100 or the shape and dimensions of a space within a drive train unit of an electric vehicle that the inverter module 600 is to be disposed within. The inverter module 600 can have a length in a range from 270 mm to 290 mm (e.g., 280 mm). The inverter module 600 can have a width in a range from 280 mm to 300 mm (e.g., 290 mm). The inverter module 600 can have a height in a range from 120 mm to 132 mm (e.g., 127 mm).

Figure 7:
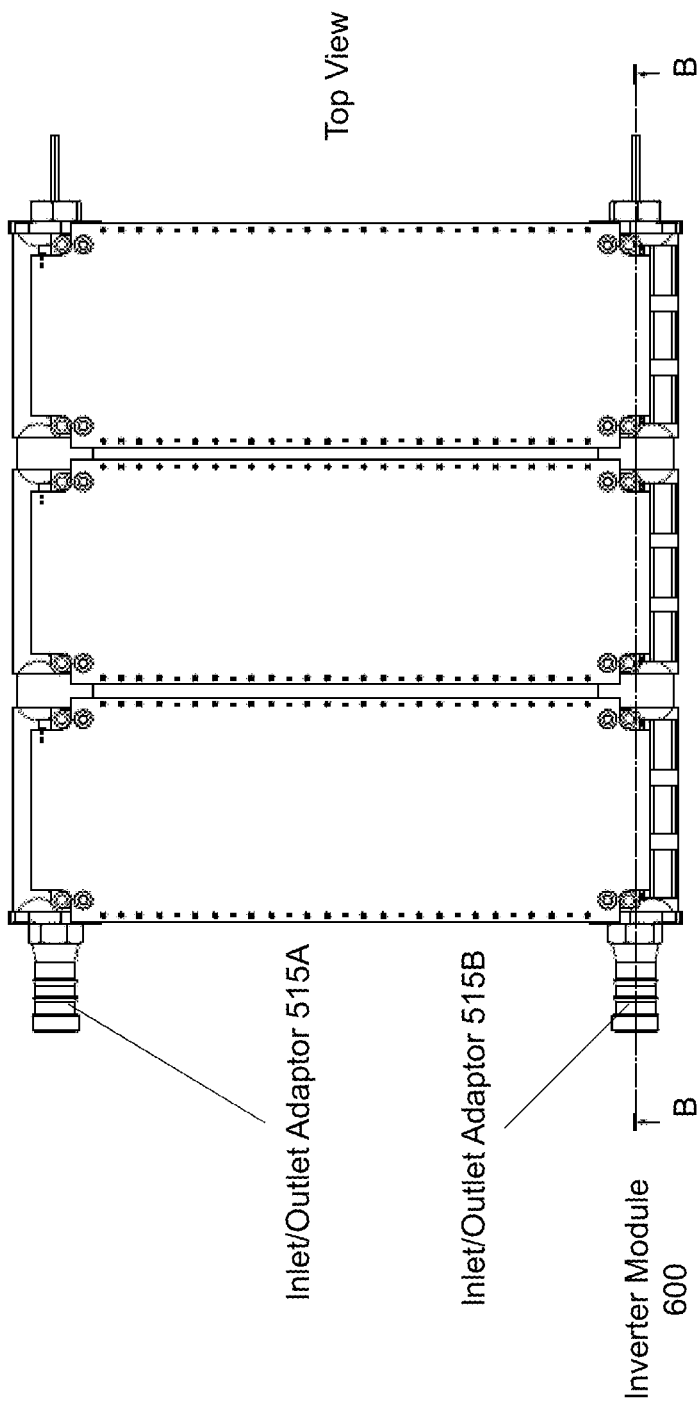
FIG. 7 depicts a top view and a cross-sectional view of an illustrative embodiment of connected inverter cells.
Figure 7:
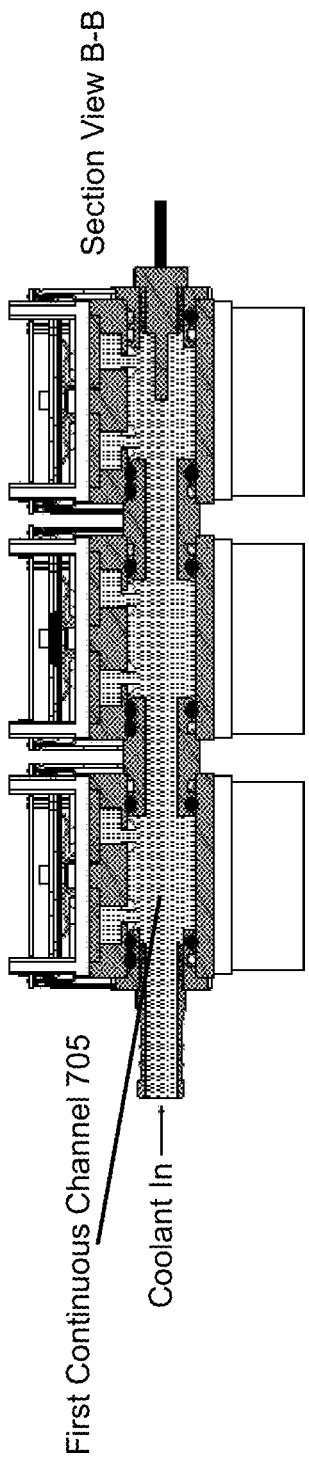

FIG. 7 shows a top view of an example inverter module 600, as well as a cross sectional view along plane B-B. The inverter module 600 can include a chain of three inverter cells 100 when connected together. In the cross sectional view, a first continuous channel 705 is shown that extends from an inlet adapter 515 at one end of the chain, and is terminated by an outlet plug 505 at the other end of the chain. Along the first continuous channel 705, a number of openings in the channel walls allow coolant fluid to flow out of the first continuous channel 705, into channels 135 that extend into a second continuous channel, and towards the designated coolant outlet.

By way of an example, an inlet/outlet adapter 515A (e.g., in FIGS. 7 and 8) coupled to a first coolant port 130A may correspond to an inlet to receive coolant fluid into an inverter cell 100. An inlet/outlet adapter 515B coupled to a second coolant port 130B may correspond to an outlet port to release coolant fluid from the inverter cell 100.

The inlet/outlet adapter 515A and the inlet/outlet adapter 515B can be fluidly coupled such that coolant fluid provided to the inlet/outlet adapter 515A can flow through the inverter module 600 to provide cooling to the components of the inverter cells 100 forming the inverter module 600, and exit the inverter module 600 through the inlet/outlet adapter 515B. For example, one or more coolant channels 135 (e.g., tubes, conduits, or hollow spaces) can couple the inlet/outlet adapter 515A to the inlet/outlet adapter 515B and the coolant channels 135 can run or extend through a length or region of the inverter module 600 such that it is positioned next to, adjacent to, or proximate to portions of one or more inverter cells 100 forming the inverter module 600 to provide cooling to the components of the inverter cells 100. The coolant channels 135 can include one or more internal wall structures or passageways of the inverter module 600 formed having a hollow inner portion to receive coolant fluid.

FIG. 8, among others, illustrates a front view of an example inverter module 600, as well as a cross sectional view along plane C-C. The inverter module 600 can include a chain multiple connected inverter cells 100. The cross sectional view shows coolant channels 135 that extend across the cold plates 110, between a first continuous channel that receives coolant from an inflow (e.g., indicated as "Coolant In"), and a second continuous channel that collects coolant for an outflow (e.g., indicated as "Coolant Out"). The coolant channels 135 can be located proximate to components in the inverter cells 100 that produce or generate heat, such as transistors 105 or capacitors 120, to allow the coolant fluid to facilitate heat transfer out of the inverter cells 100.

The cross sectional view of the cold plate 110 shows the plurality of coolant channels 135 formed within the cold plate 110. Coolant fluid can be provided to and flow through the coolant channels 135 of the cold plate 110 to absorb heat generated in the inverter cells 110. For example, the coolant fluid can perform or provide heat transfer for electronics, conductors and other components within a respective inverter cell 110. The geometry of the cold plate 110 can be selected and formed to enhance heat transfer between the material of the cold plate 110 (e.g., aluminum) and the coolant fluid flowing through the coolant channels 135.

The coolant channels 135 can be formed having a variety of different shapes, different sizes, different dimensions, or different volumes and the particular shape, size, dimensions or volume can be selected based at least in part on a particular application of the cold plate 110. For example, the coolant channels 135 can be formed having a generally round or circular shape. The coolant channels 135 can hold coolant fluid. The coolant channels 135 can be formed such that coolant fluid can flow through each of them. For example, the coolant channels 135 can be fluidly coupled with each other, or each of the coolant channels 135 can be fluidly coupled with at least one other different coolant channel 135. Each of the coolant channels 135 can have the same shape, size, dimensions, or volume. One or more of the coolant channels 135 can have a different shape, a different size, different dimensions, or a different volume, as compared to one or more of other coolant channels 135.

Figure 9:
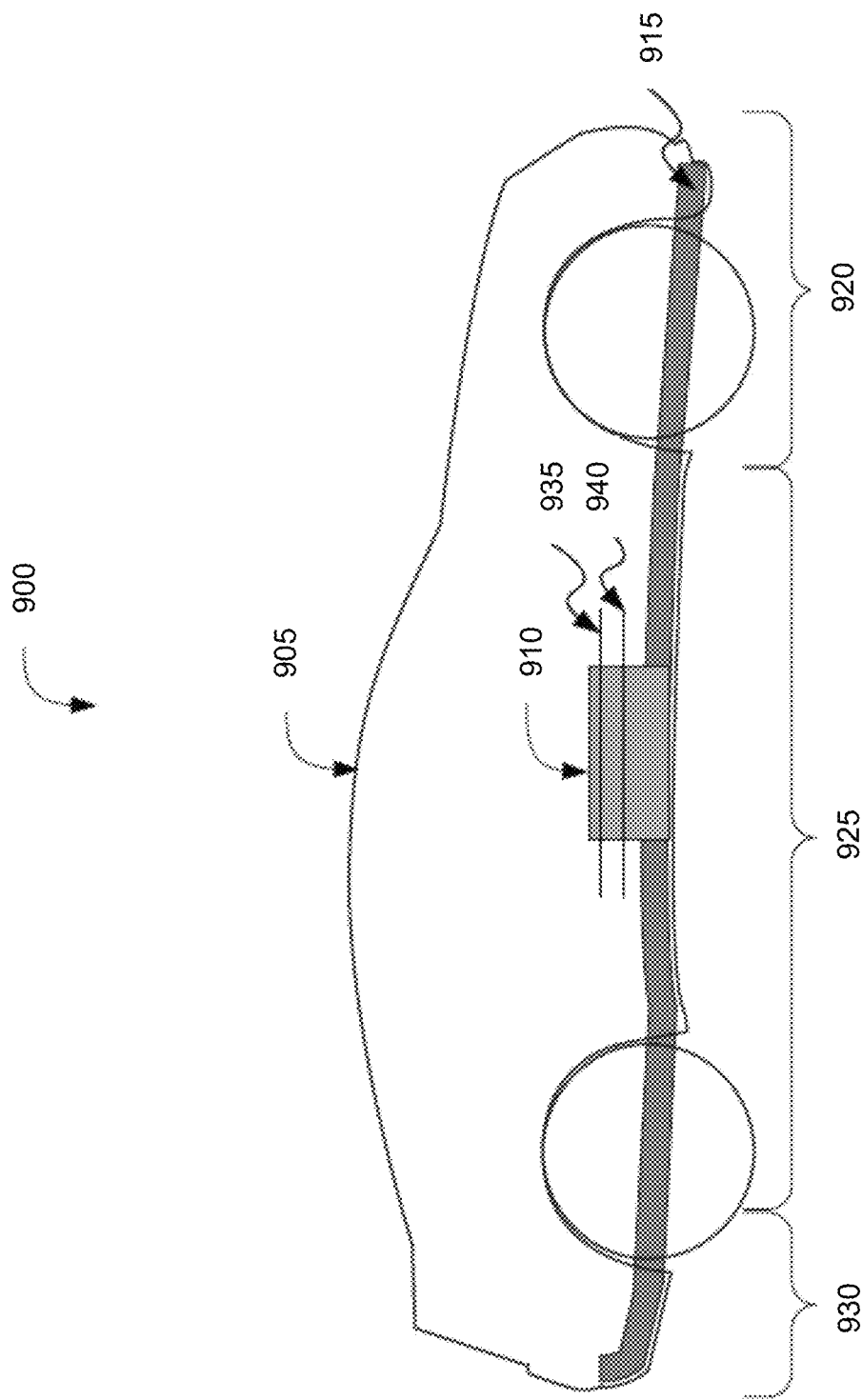
FIG. 9 is a block diagram depicting a cross-sectional view of an example electric vehicle installed with a battery pack.

FIG. 9 depicts an example cross-section view 900 of an electric vehicle 905 installed with a battery pack 910. The battery pack 910 can correspond to a drive train unit 910 of the electric vehicle 905. For example, the battery pack 910 can be disposed within or be a component of a drive train unit 910. The drive train unit 910 (and the battery pack 910) can provide power to the electric vehicle 905. For example, the drive train unit 910 may include components of the electric vehicle 905 that generate or provide power to drive the wheels or move the electric vehicle 905. The drive train unit 910 can be a component of an electric vehicle drive system. The electric vehicle drive system can transmit or provide power to different components of the electric vehicle 905. For example, the electric vehicle drive train system can transmit power from the battery pack 910 or drive train unit 910 to an axle or wheels of the electric vehicle 905.

The electric vehicle 905 can include an autonomous, semi-autonomous, or non-autonomous human operated vehicle. The electric vehicle 905 can include a hybrid vehicle that operates from on-board electric sources and from gasoline or other power sources. The electric vehicle 905 can include automobiles, cars, trucks, passenger vehicles, industrial vehicles, motorcycles, and other transport vehicles. The electric vehicle 905 can include a chassis 915 (e.g., a frame, internal frame, or support structure). The chassis 915 can support various components of the electric vehicle 905. The chassis 915 can span a front portion 920 (e.g., a hood or bonnet portion), a body portion 925, and a rear portion 930 (e.g., a trunk portion) of the electric vehicle 2005. The front portion 920 can include the portion of the electric vehicle 905 from the front bumper to the front wheel well of the electric vehicle 905. The body portion 925 can include the portion of the electric vehicle 905 from the front wheel well to the back wheel well of the electric vehicle 905. The rear portion 930 can include the portion of the electric vehicle 905 from the back wheel well to the back bumper of the electric vehicle 905.

The battery pack 910 can be installed or placed within the electric vehicle 905. The battery pack 910 can include or couple with a power converter component. Power converter component can include an inverter module or assembly having multiple inverter cells 100. The battery pack 910 can be installed on the chassis 915 of the electric vehicle 905 within the front portion 920, the body portion 925 (as depicted in FIG. 9), or the rear portion 930. The battery pack 910 can couple with a first bus-bar 935 and a second bus-bar 940 that are connected or otherwise electrically coupled with other electrical components of the electric vehicle 905 to provide electrical power from the battery pack 910.

Figure 10:
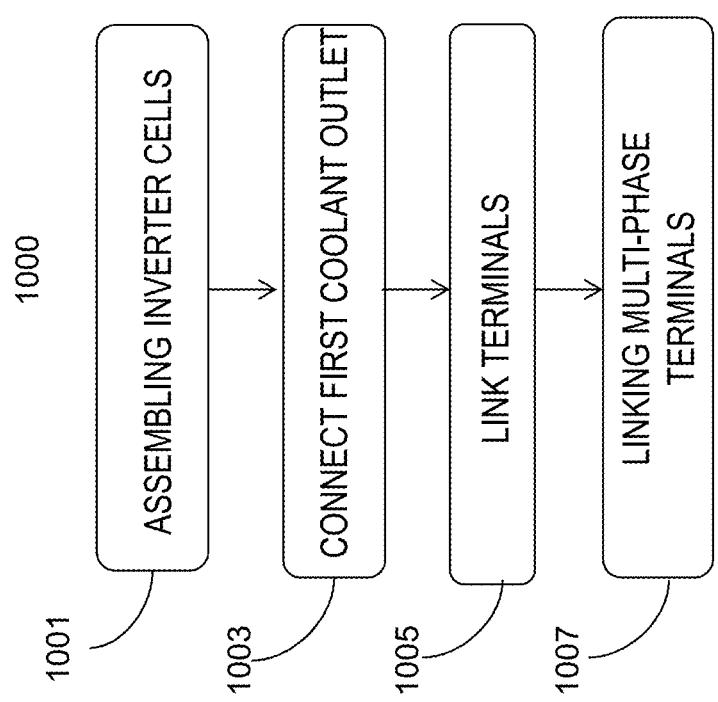
FIG. 10 is a flow diagram depicting an illustrative embodiment of a method for connecting combinable inverter cells.

Referring now to FIG. 10, among others, an example embodiment of a method 1000 for connecting combinable inverter cells 100 is depicted. The method 1000 can include assembling inverter cells 100 (ACT 1001). For instance, the method 1000 can include assembling at least a first inverter cell 100 and a second inverter cell 100. Each of the first and second inverter cells 100 can be assembled by placing a cold plate 110 of the corresponding inverter cell 100 in contact with or proximate to at least one transistor device 105 of the corresponding inverter cell 100. The cold plate 100 can be placed in contact with or proximate to at least one of: capacitor(s) 120, capacitor terminal(s), or multi-phase terminal(s) of the inverter cell 100. The cold plate 110 can have at least a first coolant channel 135B extending through the cold plate 110.

The method 1000 can include connecting a first coolant outlet (ACT 1003). The method 1000 can include connecting the first coolant outlet (or coolant port 130) of the cold plate 110 of the first inverter cell 100 to a first coolant inlet (or coolant port 130) of the cold plate 110 of the second inverter cell 100, to form a first continuous channel 705 extending from the first coolant inlet of the cold plate 110 of the first inverter cell 100 into the cold plate 110 of the second inverter cell 100. One or more additional inverter cells 100 can be connected to the first and second inverter cells 100 in a side-by-side configuration of a plurality of inverter cells 100, to extend the first continuous channel 705 for coolant flow.

For example, the first connector 510 can be used to connect the first coolant outlet of the cold plate 110 of the first inverter 100 to the first coolant inlet of the cold plate 110 of the second inverter cell 100. The first connector 510 can include one end configured to mate with the coolant outlet of the cold plate 110 of the first inverter cell 100, and another end configured to mate with the coolant inlet of the cold plate 110 of the second inverter cell 100. An outlet plug 505 can be configured to mate with the coolant outlet of the cold plate 110 of the second inverter cell 100. The outlet plug 505 can be used to seal the coolant outlet of the cold plate 110 of the second inverter cell 100, in order to terminate or block the first continuous channel 705 at one end.

Each of the cold plates 110 can include or incorporate a second coolant channel through the corresponding cold plate 110. The second coolant channel can have a second coolant inlet (or coolant port 130A or 130B) at one side of the corresponding cold plate 110 and a second coolant outlet (or coolant port 130A or 130B) on an opposite side of the corresponding cold plate 110. The second coolant channels of the cold plates 110 can be connected to form a second continuous channel that is substantially parallel (e.g., within +/−1, 3, 5, 10, 15 or other number of degrees) to the first continuous channel 705, for instance.

Each of the cold plates 110 can include or incorporate one or more channels 135 (at least a portion of which is) located proximate to the corresponding transistor device(s) 105, and implemented to direct coolant fluid flow in a direction that is substantially perpendicular (e.g., within a predefined angular deviation, such as within +/−1, 3, 5, 10, 15 or other number of degrees, from a perpendicular reference) to the first continuous channel 705 or the second continuous channel. For instance, the first continuous channel 705 or the second continuous channel can be located at opposite ends of a cold plate 110 (e.g., as shown in FIGS. 7 and 8), with a corresponding axis that can be substantially parallel (e.g., within +/−1, 3, 5, 10, 15 or other number of degrees) to a corresponding edge of one of the ends of the cold plate 110. The coolant channels 135 located proximate to the transistor device(s) 105 can be perpendicular or substantially perpendicular to the first continuous channel 705 or the second continuous channel.

The one or more coolant channels 135 can direct coolant fluid flow between the first continuous channel 705 and the second continuous channel. The first continuous channel 705 and the second continuous channel can have openings along their channel walls that allow coolant fluid outflow or inflow, to direct/channel coolant fluid to flow into or from the coolant channel(s) 135. The one or more coolant channels 135 can use the coolant fluid flow to draw heat away from the transistor device(s) 105, especially at portion(s) of the one or more coolant channels 135 located proximate to the transistor device(s) 105. For instance, heat produced by an transistor device 105 can transfer to thermal interface material (TIM) 215 pad(s) or an assembly locator frame 405 in contact with the transistor device 105, which can in turn transfer some portion of the heat to one or more heat exchanger plates 410 or a cold plate 110 in contact with the TIM 215 pad(s) or the assembly locator frame 405. The one or more heat exchanger plates 410 can be mounted on or integrated with the cold plate 110. A portion of the heat exchanger plate 410 can be exposed to or be in contact with coolant fluid flowing in a channel through the cold plate 110. Accordingly, heat transferred to the heat exchanger plate 410 or cold plate 110 can be transferred to the coolant fluid and removed via the fluidic flow of the coolant fluid into and out of the inverter cells 100.

By way of a non-limiting example, one end of the first continuous channel 705 can be implemented to allow inflow of coolant fluid for circulation through the cold plates 110. One end of the second continuous channel can be implemented to allow outflow of the coolant fluid. For instance, the section view C-C of FIG. 8 illustrates that coolant fluid can flow into one end of a first continuous channel 705, flow through the coolant channels 135 into a second continuous channel, and flow out of one end of the second continuous channel. The coolant fluid can flow in and out via any two ends of the first or second continuous channels, with the remaining ends can be blocked using outlet plugs 505.

Referring again to FIG. 10, among others, the method 1000 can include linking terminals (ACT 1005). The method 1000 can include linking positive terminals and negative terminals of one or more capacitor assemblies of the first and second inverter cells 100 to form a common positive terminal and a common negative terminal, for an inverter module 600 comprising the first and second inverter cells 100. Each of the first and second inverter cells 100 can include or incorporate an assembly of at least one capacitor 120 mounted proximate to the corresponding cold plate 110. For instance, portions of the coolant channel 135 of the cold plates 110 can be aligned across and proximate to the capacitors 120.

The cold plates 110 can be in contact with the capacitor assemblies 415, or a thermal pad 230 can be inserted between each cold plate 110 and a corresponding capacitor assembly 415 to facilitate heat transfer to the cold plate 110, and heat transfer to coolant fluid flowing through the cold plate 110. A number of capacitors 120 can be connected in parallel or in series, to form a configuration of capacitors 120 within each capacitor assembly 415. Each capacitor assembly 415 can have a positive terminal and a negative terminal, common to the corresponding configuration of capacitor(s) 120.

The positive terminals of the one or more capacitor assemblies 415 can be linked or connected, via a bus bar, PCB or other connecting structure, to provide or form a combined positive terminal for the inverter module 600 comprising the first and second inverter cells 100. The negative terminals of the capacitor assemblies 415 can be linked or connected, via a bus bar, PCB or other connecting structure, to provide or form a combined negative terminal for the inverter module 600. The connecting structure for the positive terminals and the connecting structure for the negative terminals may be separate or integrated into a single structure (e.g., insulated or laminated conductors).

Referring again to FIG. 10, among others, the method 1000 can include linking sets of multi-phase terminals (ACT 1007). The method 1000 can include linking sets of multi-phase terminals of transistor assemblies of the first and second inverter cells 100 to form a single set of multi-phase terminals for the inverter module 600. Each inverter cell 100 can incorporate a plurality of transistors 105, each transistor 105 having three terminals for instance. Each inverter cell 100 can use a multi-phase (e.g., three-phase) laminated bus bar, PCB, or other interconnecting structure to combine the transistors 105 into a transistor assembly. The interconnecting structure can connect corresponding terminals of the transistors 105, to form a single set of multi-phase terminals for each transistor assembly (or inverter cell 100).

The same type of terminals across the transistor assemblies can be linked or connected, via a bus bar, PCB or other connecting structure, to provide or form a common terminal of the same type for the inverter module 600 comprising the first and second inverter cells 100. The connecting structures for the three types of terminals may be separate or integrated into a single structure (e.g., insulated or laminated conductors, in PCB or bus bar form, for instance).

Accordingly, each connected or integrated chain or package of (two or more) inverter cells 100 can form an inverter module 600 with its own set of multi-phase terminals, pair of capacitor DC terminals, and coolant inlet and outlet. Such an inverter module 600 can be implemented for different power rating, dimensions or performance, by combining different numbers of inverter cells 100 together or using different spatial arrangements to connect or stack the inverter cells 100. For instance, the inverter cells 100 can be stacked in a one-, two- or three-dimensional array, by using various coolant channel connectors 510 and terminal connectors (or outlet plugs 505).

While operations or acts may be depicted in the drawings or described in a particular order, such operations are not required to be performed in the particular order shown or described, or in sequential order, and all depicted or described operations are not required to be performed. Actions described herein can be performed in different orders.

Having now described some illustrative implementations, it is apparent that the foregoing is illustrative and not limiting, having been presented by way of example. Features that are described herein in the context of separate implementations can also be implemented in combination in a single embodiment or implementation. Features that are described in the context of a single implementation can also be implemented in multiple implementations separately or in various sub-combinations. References to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any act or element may include implementations where the act or element is based at least in part on any act or element.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. For example, descriptions of positive and negative electrical characteristics may be reversed. For example, elements described as negative elements can instead be configured as positive elements and elements described as positive elements can instead by configured as negative elements. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

What is claimed is:

1. An inverter module, comprising: a first inverter cell and a second inverter cell disposed along a plane in an electric vehicle, each of the first inverter cell and the second inverter cell comprising:
    at least one transistor device;
    at least one capacitor;
    a cold plate having a first side that is placed in contact with or proximate to the at least one transistor device and a second side opposite of the first side that is in contact with or proximate to the at least one capacitor, the cold plate having a first coolant channel through the cold plate, the first coolant channel having a coolant inlet at a third side of the cold plate and a coolant outlet on a fourth side of the cold plate opposite to the third side; and
    one or more traverse channels located proximate to a corresponding one of the at least one transistor device to allow the coolant fluid to flow in a direction that is substantially perpendicular to the first continuous channel;
    a connector to connect the coolant outlet of the cold plate of the first inverter cell to the coolant inlet of the cold plate of the second inverter cell in series, to form a first continuous channel on the plane that extends from the first coolant inlet of the cold plate of the first inverter cell into the first coolant channel of the cold plate of the second inverter cell, the connector having:
    a first end that mates with the coolant outlet of the cold plate of the first inverter cell;
    a second end that mates with the coolant inlet of the cold plate of the second inverter cell;
    the first end, the second end, the first cooling channel and the coolant outlet of the cold plate of the first inverter cell, the coolant inlet and the first cooling channel of the cold plate of the second inverter cell aligned along an axis defined by the first continuous channel on the plane; and
    the coolant inlet of the cold plate of the first inverter cell to receive a coolant fluid into the first continuous channel, to cool the first inverter cell and the second inverter cell.

2. The inverter module of claim 1, comprising:
    an outlet plug that mates with and seals the coolant outlet of the cold plate of the second inverter cell.

3. The inverter module of claim 2, comprising: the outlet plug having a sensor rod that extends into the first continuous channel, to sense a characteristic of the coolant fluid or the first continuous channel.

4. The inverter module of claim 1, comprising: each of the cold plates includes a second coolant channel, the second coolant channel having a second coolant inlet at the fourth side of the cold plate and a second coolant outlet at the third side of the cold plate.

5. The inverter module of claim 4, comprising: the second coolant channel of each cold plate of the first inverter cell and the second inverter cell connected in series to form an additional continuous channel that is substantially parallel to the first continuous channel.

6. The inverter module of claim 5, comprising: the one or more traverse channels allow the coolant fluid to flow between the first continuous channel and the additional continuous channel.

7. The inverter module of claim 6, comprising: one end of the first continuous channel to allow inflow of the coolant fluid for circulation through each of the cold plates and one end of the additional continuous channel to allow outflow of the coolant fluid from each of the cold plates.

8. The inverter module of claim 5, comprising: an outlet adaptor having one end that mates with one end of the additional continuous channel to allow outflow of the coolant fluid from each of the cold plates.

9. The inverter module of claim 1, comprising: one or more additional inverter cells connected to the first and second inverter cells in a side-by-side configuration of inverter cells to extend the first continuous channel for the coolant fluid to flow.

10. The inverter module of claim 1, comprising: each of the first inverter cell and the second inverter cell including an assembly of the at least one capacitor mounted proximate to a corresponding one of the cold plate, and having a positive terminal and a negative terminal; and the positive terminal of the first inverter cell and the positive terminal of the second inverter cell are electrically coupled to form a common positive terminal for the inverter module and the negative terminal of the first inverter cell and the negative terminal of the second inverter cell are electrically coupled to form a common negative terminal for the inverter module.

11. The inverter module of claim 1, comprising: each of the first inverter cell and the second inverter cell including an assembly of a corresponding one of the at least one transistor device, and having a set of multi-phase terminals; and the sets of multi-phase terminals of the first inverter cell and the second inverter cell are electrically coupled to form a single set of multi-phase terminals for the inverter module.

12. The inverter module of claim 1, wherein each of the at least one transistor devices comprises an insulated-gate bipolar transistor (IGBT).

13. The inverter module of claim 1, comprising:
an inlet adaptor having one end that mates with the coolant inlet of the cold plate of the first inverter cell, and another end that mates with a coolant hose.

14. A method, comprising:
providing a first inverter cell and a second inverter cell along a plane in an inverter module of an electric vehicle, each of the first inverter cell and the second inverter cell having:
at least one transistor device;
at least one capacitor;
a cold plate having a first side that is placed in contact with or proximate to the at least one transistor device and a second side opposite of the first side that is in placed in contact with or proximate to the at least one capacitor, the cold plate having a first coolant channel through the cold plate, the first coolant channel having a coolant inlet at a third side of the cold plate and a coolant outlet on a fourth side of the cold plate opposite to the third side; and
one or more traverse channels located proximate to a corresponding one of the at least one transistor device to allow the coolant fluid to flow in a direction that is substantially perpendicular to the first continuous channel;
connecting, using a connector, the coolant outlet of the cold plate of the first inverter cell to the coolant inlet of the cold plate of the second inverter cell in series, to form a continuous channel on the plane that extends from the first coolant inlet of the cold plate of the first inverter cell into the first coolant channel of the cold plate of the second inverter cell, the connector having:
a first end that mates with the coolant outlet of the cold plate of the first inverter cell,
a second end that mates with the coolant inlet of the cold plate of the second inverter cell;
the first end, the second end, the first cooling channel and the coolant outlet of the cold plate of the first inverter cell, the coolant inlet and the first cooling channel of the cold plate of the second inverter cell aligned along an axis defined by the continuous channel on the plane; and
receiving, via the coolant inlet of the cold plate of the first inverter cell, a coolant fluid into the continuous channel to cool the first inverter cell and the second inverter cell.

15. The method of claim 14, comprising:
electrically coupling positive terminals of the first inverter cell and the second inverter cell to form a common positive terminal for the inverter module; and
electrically coupling negative terminals of the first inverter cell and the second inverter cell to form a common negative terminal for the inverter module.

16. An electric vehicle, comprising:
a first inverter cell and a second inverter cell disposed along a plane, each of the first inverter cell and the second inverter cell comprising:
at least one transistor device;
at least one capacitor;
a cold plate having a first side that is placed in contact with or proximate to the at least one transistor device and a second side opposite of the first side that is placed in contact or proximate to the at least one capacitor, the cold plate having a first coolant channel through the cold plate, the first coolant channel having a coolant inlet at a third side of the cold plate and a coolant outlet on a fourth side of the cold plate opposite to the third side; and
one or more traverse channels located proximate to a corresponding one of the at least one transistor device to allow the coolant fluid to flow in a direction that is substantially perpendicular to the first continuous channel;
a connector to connect the coolant outlet of the cold plate of the first inverter cell to the coolant inlet of the cold plate of the second inverter cell in series, to form a first continuous channel on the plane that extends from the first coolant inlet of the cold plate of the first inverter cell into the first coolant channel of the cold plate of the second inverter cell, the connector having:

a first end that mates with the coolant outlet of the cold plate of the first inverter cell a second end that mates with the coolant inlet of the cold plate of the second inverter cell;

the first end, the second end, the first cooling channel and the coolant outlet of the cold plate of the first inverter cell, the coolant inlet and the first cooling channel of the cold plate of the second inverter cell aligned along an axis defined by the first continuous channel on the plane; and the coolant inlet of the cold plate of the first inverter cell to receive a coolant fluid into the first continuous channel, to cool the first inverter cell and the second inverter cell.

17. The electric vehicle of claim 16, comprising: an outlet plug that mates with and seals the coolant outlet of the cold plate of the second inverter cell.

18. The electric vehicle of claim 16, comprising: each cold plate of the first inverter cell and the second inverter cell includes a second coolant channel, the second coolant channel having a second coolant inlet at the fourth side of the cold plate and a second coolant outlet at the third side of the cold plate.

19. The electric vehicle of claim 18, comprising: the second coolant channel of each cold plate of the first inverter cell and the second inverter cell connected in series to form an additional continuous channel that is substantially parallel to the first continuous channel.

* * * * *